(12) United States Patent
Yamazaki

(10) Patent No.: US 9,048,142 B2
(45) Date of Patent: Jun. 2, 2015

(54) SEMICONDUCTOR DEVICE

(75) Inventor: Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 151 days.

(21) Appl. No.: 13/336,549

(22) Filed: Dec. 23, 2011

(65) Prior Publication Data

US 2012/0161220 A1 Jun. 28, 2012

(30) Foreign Application Priority Data

Dec. 28, 2010 (JP) ................. 2010-293343

(51) Int. Cl.
| | |
|---|---|
| *H01L 27/108* | (2006.01) |
| *H01L 27/12* | (2006.01) |
| *H01L 27/115* | (2006.01) |
| *C04B 35/58* | (2006.01) |
| *G11C 13/00* | (2006.01) |
| *G11C 16/04* | (2006.01) |

(52) U.S. Cl.
CPC ........ *H01L 27/1225* (2013.01); *H01L 27/1156* (2013.01); *G11C 13/0004* (2013.01); *G11C 16/0433* (2013.01); *C04B 35/58* (2013.01); *C04B 2235/3284* (2013.01); *C04B 2235/3286* (2013.01)

(58) Field of Classification Search
CPC ................ H01L 27/06; H01L 27/1085; H01L 27/10852; H01L 27/10855
USPC ......... 257/300, 298, 303, 306, 307, 532, 296, 257/368, E27.06, E29.34
See application file for complete search history.

(56) References Cited

U.S. PATENT DOCUMENTS

| | | | |
|---|---|---|---|
| 4,466,081 A | | 8/1984 | Masuoka |
| 4,609,986 A | | 9/1986 | Hartmann et al. |
| 4,642,487 A | | 2/1987 | Carter |
| 4,870,302 A | | 9/1989 | Freeman |
| 4,902,637 A | * | 2/1990 | Kondou et al. ............... 438/152 |
| 5,100,817 A | * | 3/1992 | Cederbaum et al. .......... 438/152 |

(Continued)

FOREIGN PATENT DOCUMENTS

| | | |
|---|---|---|
| EP | 0 053 878 A2 | 6/1882 |
| EP | 0 053 878 A2 | 6/1982 |

(Continued)

OTHER PUBLICATIONS

U.S. Appl. No. 12/906,565.*

(Continued)

*Primary Examiner* — Yu-Hsi D Sun
*Assistant Examiner* — Lauren R Bell
(74) *Attorney, Agent, or Firm* — Fish & Richardson P.C.

(57) ABSTRACT

The degree of integration of a semiconductor device is enhanced and the storage capacity per unit area is increased. The semiconductor device includes a first transistor provided in a semiconductor substrate and a second transistor provided over the first transistor. In addition, an upper portion of a semiconductor layer of the second transistor is in contact with a wiring, and a lower portion thereof is in contact with a gate electrode of the first transistor. With such a structure, the wiring and the gate electrode of the first transistor can serve as a source electrode and a drain electrode of the second transistor, respectively. Accordingly, the area occupied by the semiconductor device can be reduced.

13 Claims, 14 Drawing Sheets

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,127,702 A | 10/2000 | Yamazaki et al. |
| 6,294,274 B1 | 9/2001 | Kawazoe et al. |
| 6,314,017 B1 | 11/2001 | Emori et al. |
| 6,563,174 B2 | 5/2003 | Kawasaki et al. |
| 6,727,522 B1 | 4/2004 | Kawasaki et al. |
| 6,781,865 B2 | 8/2004 | Ohtsuka et al. |
| 7,030,650 B1 | 4/2006 | Kaptanoglu et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,054,121 B2 | 11/2011 | Kato |
| 8,314,637 B2 | 11/2012 | Kato et al. |
| 8,339,828 B2 | 12/2012 | Yamazaki et al. |
| 8,339,836 B2 | 12/2012 | Yamazaki et al. |
| 2001/0046027 A1 | 11/2001 | Tai et al. |
| 2002/0056838 A1 | 5/2002 | Ogawa |
| 2002/0096702 A1 | 7/2002 | Ishii et al. |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0237786 A1 | 10/2005 | Atwood et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0047286 A1 | 3/2007 | Miki |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0280058 A1* | 11/2008 | Krunks et al. ............... 427/453 |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0114918 A1* | 5/2009 | Wang et al. ..................... 257/59 |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0089417 A1* | 4/2011 | Yamazaki et al. ............ 257/43 |
| 2011/0101332 A1 | 5/2011 | Yamazaki et al. |
| 2011/0101351 A1* | 5/2011 | Yamazaki ..................... 257/57 |
| 2011/0114945 A1* | 5/2011 | Yamazaki et al. ............ 257/43 |
| 2011/0121878 A1 | 5/2011 | Kato et al. |
| 2011/0122673 A1 | 5/2011 | Kamata et al. |
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |
| 2011/0156025 A1 | 6/2011 | Shionoiri et al. |
| 2011/0156027 A1 | 6/2011 | Yamazaki et al. |
| 2011/0156028 A1 | 6/2011 | Yamazaki et al. |
| 2011/0156117 A1 | 6/2011 | Yamazaki et al. |
| 2011/0157961 A1 | 6/2011 | Yamazaki et al. |
| 2011/0175083 A1 | 7/2011 | Sekine et al. |
| 2011/0175087 A1 | 7/2011 | Yamazaki et al. |
| 2011/0175104 A1 | 7/2011 | Yamazaki |
| 2011/0175646 A1 | 7/2011 | Takemura et al. |
| 2011/0176263 A1 | 7/2011 | Yamazaki et al. |
| 2011/0176348 A1 | 7/2011 | Yamazaki et al. |
| 2011/0176355 A1 | 7/2011 | Furutani et al. |
| 2011/0176377 A1 | 7/2011 | Koyama |
| 2011/0182110 A1 | 7/2011 | Yamazaki et al. |
| 2011/0186837 A1 | 8/2011 | Takahashi et al. |
| 2011/0187410 A1 | 8/2011 | Kato et al. |
| 2011/0194327 A1 | 8/2011 | Kawae |
| 2011/0194332 A1 | 8/2011 | Saito |
| 2012/0293200 A1 | 11/2012 | Takemura |
| 2012/0293201 A1 | 11/2012 | Fujita et al. |
| 2012/0293202 A1 | 11/2012 | Nishijima et al. |
| 2012/0293203 A1 | 11/2012 | Ohmaru et al. |
| 2012/0293206 A1 | 11/2012 | Yoneda et al. |
| 2012/0293242 A1 | 11/2012 | Kato |
| 2012/0306533 A1 | 12/2012 | Ohmaru |

FOREIGN PATENT DOCUMENTS

| | | |
|---|---|---|
| EP | 1 737 044 A1 | 12/2006 |
| EP | 2 226 847 A2 | 9/2010 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |

(56) References Cited

FOREIGN PATENT DOCUMENTS

| JP | 63-215519 A | 9/1988 |
|---|---|---|
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

U.S. Appl. No. 12/913,464.*
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069
Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDs," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda., T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MoO3 As a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.
Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.
Li, C et al. "Modulated Structures of Homologous Compounds InMo3(ZnO)m (M=In,Ga; m=Integer) Described by Four-Dimensional Superspace Group," Journal of Solid State Chemistry, 1998, vol. 139, pp. 347-355.

(56) References Cited

OTHER PUBLICATIONS

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "SUFTLA Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.
Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.
Oba, F et al., "Defect energetics in ZnO: A hybrid Hartree-Fock density functional study," Phys. Rev. B (Physical Review. B), 2008, vol. 77, pp. 245202-1-245202-6.
Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.
Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 2009, pp. 284-287.
Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Orita, M et al., "Amorphous transparent conductive oxide InGaO3(ZnO)m (m<4):a Zn4s conductor," Philosophical Magazine, 2001, vol. 81, No. 5, pp. 501-515.
Orita, M et al., "Mechanism of Electrical Conductivity of Transparent InGaZnO4," Phys. Rev. B (Physical Review. B), Jan. 15, 2000, vol. 61, No. 3, pp. 1811-1816.
Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.
Osada, T et al., "Development of Driver-Integrated Panel Using Amorphous In—Ga—Zn—Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium—Gallium—Zinc Oxide TFTs and Their Application for Large Size AMOLED." AM-FPD '08 Digest of Technical Papers, Jul. 2, 2008, pp. 275-278.
Park, S et al., "Challenge to Future Displays: Transparent AM-OLED Driven by Peald Grown ZnO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-IN. AMOLED Display With Driver Circuit Using Amorphous In—Ga—Zn—Oxide TFTs," IDW '09 : Proceedings of the 16th International Display Workshops, 2009, pp. 689-692.
Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.
Van de Walle, C, "Hydrogen as a Cause of Doping in Zinc Oxide," Phys. Rev. Lett. (Physical Review Letters), Jul. 31, 2000, vol. 85, No. 5, pp. 1012-1015.
Ishii, T et al., "A Poly-Silicon TFT With a Sub-5-nm Thick Channel for Low-Power Gain Cell Memory in Mobile Applications," IEEE Transactions on Electron Devices, vol. 51, No. 11, Nov. 1, 2004, pp. 1805-1810.
Jeon, S et al., "180nm Gate Length Amorphous InGaZnO Thin Film Transistor for High Density Image Sensor Applications," IEDM 10, Technical Digest of International Electron Devices Meeting, 2010, pp. 504-507.
Kim, W et al., "An Experimental High-Density DRAM Cell with a Built-in Gain Stage," IEEE Journal of Solid State Circuits, vol. 29, No. 8, Aug. 1, 1994, pp. 978-981.
Shukuri, S et al., "A Complementary Gain Cell Technology for Sub-1V Supply DRAMs," IEDM 92: Technical Digest of International Electron Devices Meeting, Dec. 13, 1992, pp. 1006-1008.
Shukuri, S et al., "A Semi-Static Complementary Gain Cell Technology for Sub-1 V Supply DRAM's," IEEE Transactions on Electron Devices, vol. 41, No. 6, Jun. 1, 1994, pp. 926-931.

\* cited by examiner

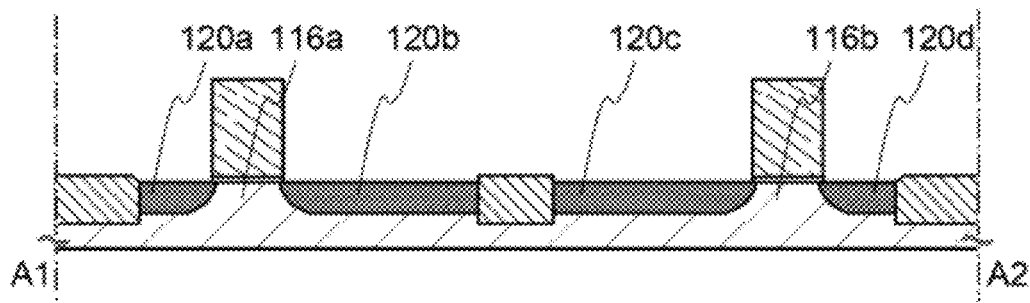
FIG. 3A
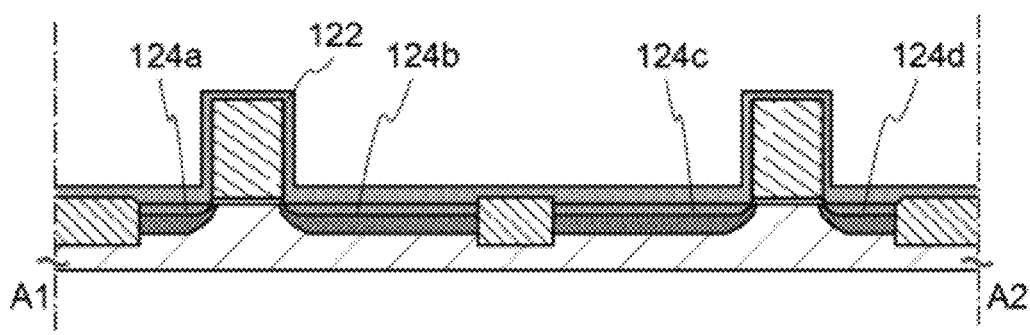
FIG. 3B
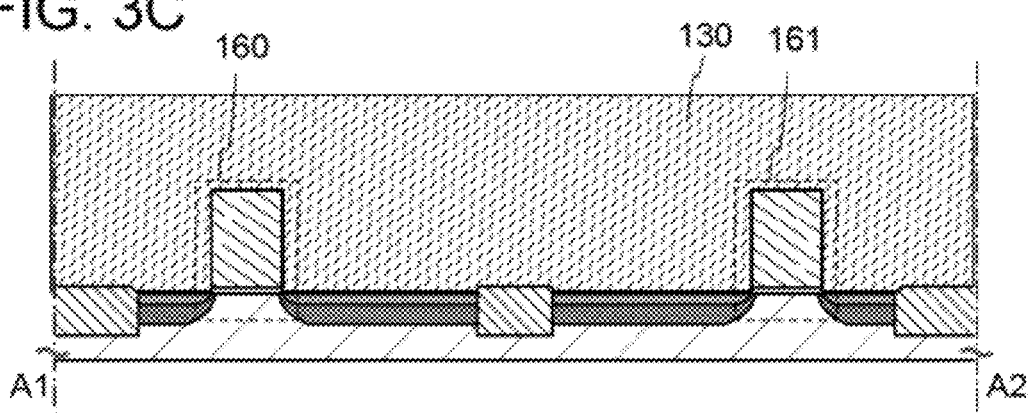
FIG. 3C
FIG. 3D
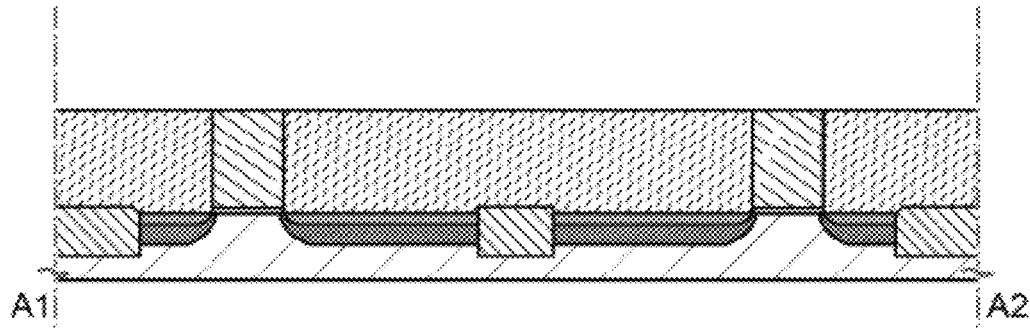

9,048,142 B2

SEMICONDUCTOR DEVICE

BACKGROUND OF THE INVENTION

1. Field of the Invention

The disclosed invention relates to a semiconductor device using a semiconductor element and a method for driving the semiconductor device.

2. Description of the Related Art

Memory devices using semiconductor elements are broadly classified into two categories: a volatile memory device that loses stored data when power supply stops, and a nonvolatile memory device that holds stored data even when power is not supplied.

A typical example of a volatile memory device is a dynamic random access memory (DRAM). A DRAM stores data in such a manner that a transistor included in a memory element is selected and electric charge is stored in a capacitor.

When data is read from a DRAM, electric charge in a capacitor is lost according to the above-described principle; thus, another writing operation is necessary every time data is read out. Moreover, a transistor included in a memory element has leakage current (off-state current) between a source and a drain in an off state or the like and electric charge flows into or out of the transistor even if the transistor is not selected, which makes a data holding period short. For that reason, a writing operation (refresh operation) is necessary at predetermined intervals, and it is difficult to sufficiently reduce power consumption. Furthermore, since stored data is lost when power supply stops, another memory device utilizing a magnetic material or an optical material is needed in order to hold the data for a long time.

Another example of a volatile memory device is a static random access memory (SRAM). An SRAM holds stored data by using a circuit such as a flip-flop and thus does not need a refresh operation, which is an advantage over a DRAM. However, cost per storage capacity is higher because a circuit such as a flip-flop is used. Moreover, as in a DRAM, stored data in an SRAM is lost when power supply stops.

A typical example of a nonvolatile memory device is a flash memory. A flash memory includes a floating gate between a gate electrode and a channel formation region in a transistor and stores data by holding electric charge in the floating gate. Therefore, a flash memory has advantages in that the data holding time is extremely long (almost permanent) and a refresh operation which is necessary to a volatile memory device is not needed (e.g., see Patent Document 1).

However, in a flash memory, there is a problem in that a memory element becomes unable to function after a predetermined number of writing operations because a gate insulating layer included in the memory element deteriorates due to tunneling current generated in writing operations. In order to reduce effects of this problem, a method in which the number of writing operations is equalized among memory elements can be employed, for example, but a complex peripheral circuit is needed to realize this method. Moreover, even when such a method is employed, the fundamental problem of lifetime is not resolved. In other words, a flash memory is not suitable for applications in which data is frequently rewritten.

In addition, high voltage is necessary in order to inject electric charge into the floating gate or remove the electric charge, and a circuit therefor is required. Further, it takes a relatively long time to inject or remove electric charge, and it is not easy to increase the speed of writing and erasing data.

Another example of a nonvolatile memory device is a magnetoresistive random access memory (MRAM) which is a memory device including a magnetic material. An MRAM consumes a comparatively large amount of current in a writing operation; therefore, there is a problem in that it is difficult for an MRAM to concurrently perform a writing operation in a number of memory cells.

REFERENCE

[Patent Document 1] Japanese Published Patent Application No. S57-105889

SUMMARY OF THE INVENTION

In view of the foregoing problems, an object of one embodiment of the present invention is to provide a semiconductor device with a novel structure, which can hold stored data even when not powered and which has an unlimited number of writing operations. Further, another object is to enhance the degree of integration of the semiconductor device with a novel structure and increase the storage capacity per unit area.

According to one embodiment of the present invention, a semiconductor device includes a first transistor and a second transistor. The first transistor includes a first channel formation region, and a first impurity region and a second impurity region provided so that the first channel formation region is sandwiched therebetween, in which the first channel formation region, the first impurity region, and the second impurity region are provided in a semiconductor substrate; a first gate insulating layer over the first channel formation region; a first gate electrode over the first gate insulating layer; and a first source electrode and a first drain electrode provided in contact with the first impurity region and the second impurity region, respectively. The second transistor includes a first insulating layer which is in contact with the first transistor and provided so that the upper surface of the first gate electrode is exposed; a semiconductor layer which is provided over the first gate electrode and the first insulating layer and includes a second channel formation region, and a first low-resistance region and a second low-resistance region provided so that the second channel formation region is sandwiched therebetween; a conductive layer provided in contact with the semiconductor layer; a second gate insulating layer provided so as to cover the semiconductor layer; and a second gate electrode provided over the second channel formation region with the second gate insulating layer sandwiched therebetween. The first gate electrode serves as one of a second source electrode and a second drain electrode of the second transistor, and the conductive layer serves as the other of the second source electrode and the second drain electrode of the second transistor.

According to another embodiment of the present invention, a semiconductor device includes a first transistor and a second transistor. The first transistor includes a first channel formation region, and a first impurity region and a second impurity region provided so that the first channel formation region is sandwiched therebetween, in which the first channel formation region, the first impurity region, and the second impurity region are provided in a semiconductor substrate; a first gate insulating layer over the first channel formation region; a first gate electrode over the first gate insulating layer; and a first source electrode and a first drain electrode provided in contact with the first impurity region and the second impurity region, respectively. The second transistor includes a first insulating layer which is in contact with the first transistor and provided so that the upper surface of the first gate electrode is exposed; a semiconductor layer which is provided over the first gate electrode and the first insulating layer and includes a second channel formation region, and a first low-resistance region and a second low-resistance region provided so that the second channel formation region is sandwiched therebetween; a first conductive layer provided in contact with the semiconductor layer; a second gate insulating layer provided so as to cover the semiconductor layer; and a second gate electrode provided over the second channel formation region with the second gate insulating layer sandwiched therebetween. A second conductive layer is provided over the first gate electrode so as to overlap with the first gate electrode with the semiconductor layer and the second gate insulating layer sandwiched therebetween. The first gate electrode serves as one of a second source electrode and a second drain electrode of the second transistor, and the first conductive layer serves as the other of the second source electrode and the second drain electrode of the second transistor. The stack of the first gate electrode, the semiconductor layer, the second gate insulating layer, and the second conductive layer serves as a capacitor.

In the semiconductor device having the above structure, the semiconductor layer includes an oxide semiconductor material, and the semiconductor substrate includes a semiconductor material other than an oxide semiconductor.

In the semiconductor device having the above structure, the oxide semiconductor material includes a crystal that is c-axis aligned, has a triangular or hexagonal atomic arrangement when seen from the direction perpendicular to an a-b plane, and has a variation in the direction of an a-axis or a b-axis in the a-b plane.

In the semiconductor device having the above structure, the second gate electrode includes an In—Ga—Zn—O—N-based compound conductor.

Note that although, in the above semiconductor devices, the transistor may be formed using an oxide semiconductor material, the disclosed invention is not limited thereto. A material capable of realizing off-state current characteristics comparable to those of an oxide semiconductor material; for example, a widegap material (specifically, a semiconductor material having an energy gap Eg of more than 3 eV, for example), such as silicon carbide, or the like may be employed.

Note that the term such as "over" or "below" in this specification and the like does not necessarily mean that a component is placed "directly on" or "directly under" another component. For example, the expression "a gate electrode over a gate insulating layer" does not exclude the case where another component is placed between the gate insulating layer and the gate electrode. Moreover, the terms such as "over" and "below" are simply used for convenience of explanation.

In addition, the term such as "electrode" or "wiring" in this specification and the like does not limit a function of a component. For example, an "electrode" can be used as part of a "wiring", and the "wiring" can be used as part of the "electrode". Furthermore, the term "electrode" or "wiring" can include the case where a plurality of "electrodes" or "wirings" is formed in an integrated manner.

Functions of a "source" and a "drain" are sometimes interchanged with each other when a transistor of opposite polarity is used or when the direction of current flowing is changed in circuit operation, for example. Therefore, the terms "source" and "drain" can be replaced with each other in this specification and the like.

Note that the term "electrically connected" in this specification and the like includes the case where components are connected through an "object having any electric function". There is no particular limitation on an object having any electric function as long as electric signals can be transmitted and received between components that are connected through the object.

Since the off-state current of a transistor including an oxide semiconductor material is extremely small, stored data can be held for an extremely long period by using the transistor for a memory device. In other words, a refresh operation becomes unnecessary or the frequency of the refresh operation can be extremely low, which leads to a sufficient reduction in power consumption. Moreover, stored data can be held for a long period even when power is not supplied (note that the potential is preferably fixed).

Further, a memory device including a transistor including an oxide semiconductor material does not need high voltage for data writing and does not have the problem of deterioration of a memory element. For example, unlike a conventional nonvolatile memory device, it is not necessary to inject and extract electrons into and from a floating gate, and thus a problem such as deterioration of a gate insulating layer does not arise at all. In other words, the memory device including a transistor including an oxide semiconductor material has no limitation on the number of times data can be rewritten, which is a problem of a conventional nonvolatile memory device, and the reliability thereof is markedly improved. Furthermore, since data is written by turning on or off the transistor, high-speed operation can be easily achieved. Additionally, there is an advantage in that an operation for erasing data is not needed.

Further, a transistor including a semiconductor material other than an oxide semiconductor can operate at sufficiently higher speed than a transistor including an oxide semiconductor material. Therefore, when a transistor including a semiconductor material other than an oxide semiconductor is used for a peripheral circuit (e.g., a control circuit or a driver circuit), a peripheral circuit which operates at sufficiently high speed can be favorably achieved. Accordingly, when such a peripheral circuit is combined with a memory device including a transistor including an oxide semiconductor material, a semiconductor device can perform operation (e.g., a data reading operation or a data writing operation) at sufficiently high speed.

A semiconductor device having a novel feature can be realized by being provided with both a peripheral circuit including a transistor including a semiconductor material other than an oxide semiconductor (in other words, a transistor capable of operating at sufficiently high speed) and a memory device including a transistor including an oxide semiconductor material (in a broader sense, a transistor whose off-state current is sufficiently small).

Further, in the semiconductor device according to one embodiment of the present invention, a gate electrode of a transistor including a semiconductor material other than an oxide semiconductor serves as one of a source electrode and a drain electrode of a transistor including an oxide semiconductor, whereby one of the source electrode and the drain electrode of the transistor including an oxide semiconductor does not need to be connected to another wiring through an opening. Therefore, the area occupied by the memory cells can be reduced, whereby the degree of integration of a semiconductor device can be enhanced and the storage capacity per unit area can be increased.

BRIEF DESCRIPTION OF THE DRAWINGS

FIGS. 3A to 3D are cross-sectional views illustrating a manufacturing process of a semiconductor device.

DETAILED DESCRIPTION OF THE INVENTION

Figure 1A:
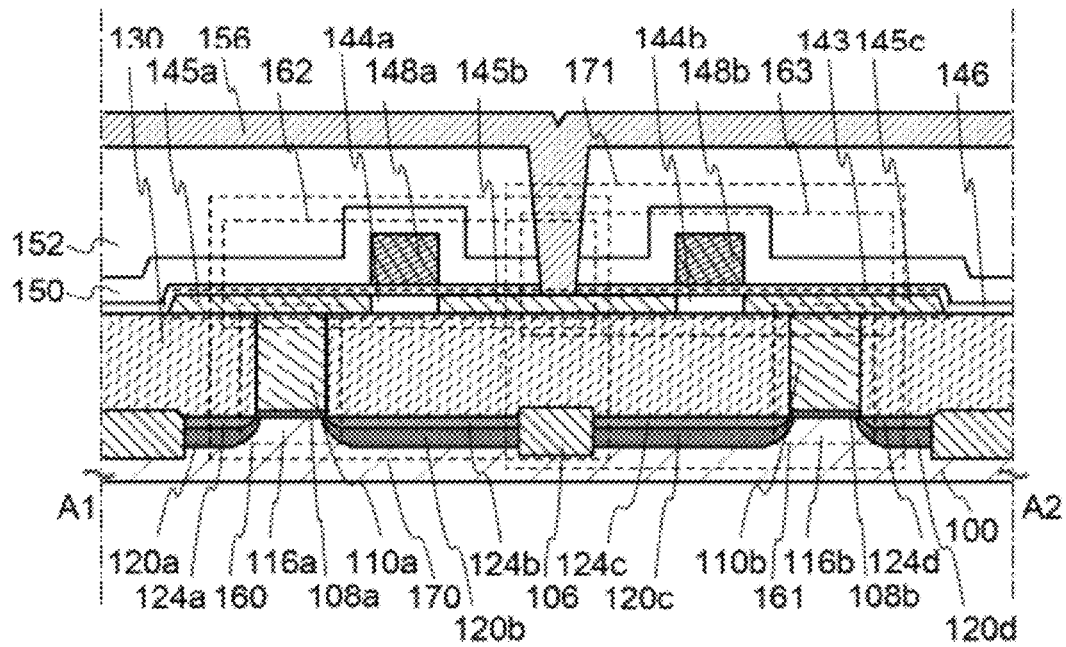
FIGS. 1A and 1B are a cross-sectional view and a circuit diagram, respectively, of a semiconductor device.

Examples of embodiments of the present invention will be described below with reference to the drawings. Note that the present invention is not limited to the following description, and it will be readily appreciated by those skilled in the art that the mode and details can be changed in various different ways without departing from the spirit and the scope of the present invention. Therefore, the present invention should not be construed as being limited to the following description of the embodiments.

Note that the position, size, range, or the like of each component illustrated in drawings and the like is not accurately represented in some cases for easy understanding. Therefore, the disclosed invention is not necessarily limited to the position, size, range, or the like as disclosed in the drawings and the like.

Note that ordinal numbers such as "first", "second", and "third" in this specification and the like are used in order to avoid confusion among components, and the terms do not limit the components numerically.

Embodiment 1

In this embodiment, a structure and a manufacturing method of semiconductor devices according to one embodiment of the present invention will be described with reference to FIGS. 1A and 1B, FIGS. 2A to 2D, FIGS. 3A to 3D, FIGS. 4A to 4C, and FIGS. 5A to 5C.

<Example of Structure of Semiconductor Device>

Figure 1B:
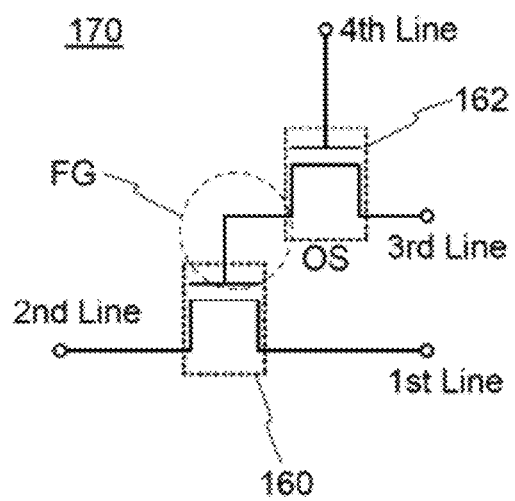

FIGS. 1A and 1B illustrate an example of a structure of the semiconductor device. FIG. 1A is a cross-sectional view of the semiconductor device, and FIG. 1B is a circuit diagram of the semiconductor device. The semiconductor device in FIGS. 1A and 1B can be used as a memory device. Note that the semiconductor device illustrated in FIGS. 1A and 1B is just an example of a semiconductor device having predetermined functions and does not represent all semiconductor devices according to one embodiment of the present invention. The semiconductor device according to one embodiment of the present invention can have another function by changing connection of an electrode or the like as appropriate.

The semiconductor device illustrated in FIG. 1A includes, in a lower portion, a transistor 160 and a transistor 161, and in an upper portion, a transistor 162 and a transistor 163. In addition, the transistors 160 and 162 can form a memory cell 170, and the transistors 161 and 163 can form a memory cell 171.

Here, a semiconductor material of the transistors 162 and 163 and a semiconductor material of the transistors 160 and 161 are preferably different. For example, an oxide semiconductor can be used as the semiconductor material of the transistors 162 and 163, and a semiconductor material (such as silicon) other than an oxide semiconductor can be used for the transistors 160 and 161. A transistor including an oxide semiconductor has a characteristic of extremely small off-state current. Therefore, electric charge can be held for a long time owing to its characteristics. On the other hand, a transistor including a semiconductor material other than an oxide semiconductor can operate at high speed easily.

The transistor 160 in FIG. 1A includes a channel formation region 116a and impurity regions 120a and 120b provided such that the channel formation region 116a is sandwiched therebetween, each of which is provided in a substrate 100 including a semiconductor material (such as silicon); metal compound regions 124a and 124b in contact with the impurity regions 120a and 120b, respectively; a gate insulating layer 108a provided over the channel formation region 116a; and a gate electrode 110a provided over the gate insulating layer 108a. Here, the impurity regions 120a and 120b serve as a source region and a drain region.

In a similar manner, the transistor 161 includes a channel formation region 116b and impurity regions 120c and 120d provided such that the channel formation region 116b is sandwiched therebetween, each of which is provided in the substrate 100 including a semiconductor material; metal compound regions 124c and 124d in contact with the impurity regions 120c and 120d, respectively; a gate insulating layer 108b provided over the channel formation region 116b; and a gate electrode 110b provided over the gate insulating layer 108b. Here, the impurity regions 120c and 120d serve as a source region and a drain region.

Note that a transistor whose source electrode and drain electrode are not illustrated in a drawing may also be referred to as a transistor for the sake of convenience. Further, in such a case, in description of a connection of a transistor, a source region and a source electrode may be collectively referred to as a source electrode, and a drain region and a drain electrode may be collectively referred to as a drain electrode. That is, in this specification, the term "source electrode" may include a source region.

Further, an element isolation insulating layer 106 is formed over the substrate 100 so as to surround the transistor 160. In addition, the transistor 161 is also surrounded by the element isolation insulating layer 106. Note that in order to realize higher integration, the transistor 160 can have a structure without a sidewall insulating layer as illustrated in FIG. 1A. On the other hand, in the case where characteristics of the transistors in the lower portion have priority, a sidewall insulating layer may be provided on a side surface of the gate electrode, and the impurity regions may include a region having a different impurity concentration.

Furthermore, an insulating layer 130 is formed so as to be in contact with the transistors 160 and 161. Note that the insulating layer 130 is provided so as to expose the top surfaces of the gate electrode 110a of the transistor 160 and the gate electrode 110b of the transistor 161.

In FIG. 1A, the transistor 162 is provided over the insulating layer 130 and the gate electrode 110a, and the transistor 163 is provided over the insulating layer 130 and the gate electrode 110b.

The transistor 162 includes an oxide semiconductor layer 143 including a channel formation region 144a, and a low-resistance region 145a and a low-resistance region 145b provided so that the channel formation region 144a is sandwiched therebetween; a wiring 156 provided in contact with the oxide semiconductor layer 143; a gate insulating layer 146 provided so as to cover the oxide semiconductor layer 143; and a gate electrode 148a provided over the channel formation region 144a with the gate insulating layer 146 sandwiched therebetween. In addition, in the transistor 162, the upper portion of the low-resistance region 145b is connected to the wiring 156, and the lower portion of the low-resistance region 145a is connected to the gate electrode 110a. That is, the gate electrode 110a serves as one of a source electrode and a drain electrode of the transistor 162, and the wiring 156 serves as the other of the source electrode and the drain electrode of the transistor 162.

Further, the transistor 163 includes the oxide semiconductor layer 143 including a channel formation region 144b, and the low-resistance region 145b and a low-resistance region 145c provided so that the channel formation region 144b is sandwiched therebetween; the wiring 156 provided in contact with the oxide semiconductor layer 143; the gate insulating layer 146 provided so as to cover the oxide semiconductor layer 143; and a gate electrode 148b provided over the channel formation region 144b with the gate insulating layer 146 sandwiched therebetween. In addition, in the transistor 163, the upper portion of the low-resistance region 145b is connected to the wiring 156, and the lower portion of the low-resistance region 145c is connected to the gate electrode 110b. That is, the gate electrode 110b serves as one of a source electrode and a drain electrode of the transistor 163, and the wiring 156 serves as the other of the source electrode and the drain electrode of the transistor 163.

Furthermore, an interlayer insulating layer 150 and an interlayer insulating layer 152 are provided so as to cover the transistors 162 and 163.

Although not illustrated, sidewall insulating layers may be provided on the side surfaces of the gate electrodes 148a and 148b in the transistors 162 and 163, and the impurity regions may include a region having a different impurity concentration.

As illustrated in FIG. 1A, the gate electrode 110a of the transistor 160 serves as one of the source electrode and the drain electrode of the transistor 162, whereby one of the source electrode and the drain electrode of the transistor 162 does not need to be connected to another wiring through an opening in the interlayer insulating layer 152. In addition, the transistors 162 and 163 are formed using one oxide semiconductor layer, the oxide semiconductor layer 143. Further, the transistors 162 and 163 are connected to each other by sharing the wiring 156 serving as a source electrode and a drain electrode. Further, in adjacent memory cells, the other of the source electrode and the drain electrode of the transistor 162 and the other of the source electrode and the drain electrode of the transistor 163, which include the oxide semiconductor layer 143, can be electrically connected to each other.

With the above structure, the area occupied by the memory cells 170 and 171 can be reduced, whereby the degree of integration of a semiconductor device can be enhanced and the storage capacity per unit area can be increased.

Next, a circuit diagram of the memory cell 170 in FIG. 1A is illustrated in FIG. 1B. Note that in this specification and the like, "OS" is sometimes used to denote a transistor including an oxide semiconductor.

In the memory cell 170 illustrated in FIG. 1B, a first wiring (a first line, also referred to as a source line) is electrically connected to a source electrode of the transistor 160, and a second wiring (a second line, also referred to as a bit line) is electrically connected to a drain electrode of the transistor 160. A third wiring (a third line, also referred to as a first signal line) is electrically connected to the other of the source electrode and the drain electrode of the transistor 162, and a fourth wiring (a fourth line, also referred to as a second signal line) is electrically connected to the gate electrode of the transistor 162. The gate electrode of the transistor 160 and one of the source electrode and the drain electrode of the transistor 162 are electrically connected to each other.

Note that one of the source electrode and the drain electrode of the transistor 162 is electrically connected to the gate electrode of the transistor 160 and therefore has a function similar to that of a floating gate of a floating gate transistor used for a nonvolatile memory element. Therefore, a portion in the drawing where one of the source electrode and the drain electrode of the transistor 162 is electrically connected to the gate electrode of the transistor 160 is called a floating gate portion FG in some cases. When the transistor 162 is turned off, the floating gate portion FG can be regarded as being embedded in an insulator and thus electric charge is held in the floating gate portion FG. The off-state current of the transistor 162 including an oxide semiconductor is smaller than or equal to $1/100000$ of the off-state current of a transistor including silicon or the like; thus, loss of the electric charge accumulated in the floating gate portion FG due to leakage in the transistor 162 is negligible. That is, with the transistor 162 including an oxide semiconductor, a nonvolatile memory device which can hold data without being supplied with power can be realized.

Since the transistor 160 including a material other than an oxide semiconductor can operate at sufficiently high speed, stored data can be read out at high speed by using the transistor 160. The transistor 162 including an oxide semiconductor has a characteristic of extremely small off-state current. For that reason, a potential of the gate electrode of the transistor 160 can be held for an extremely long period by turning off the transistor 162.

By utilizing a feature in which the potential of the gate electrode of the transistor 160 can be held, data can be written, held, and read as follows. The operation of the memory cell 170 will be described below.

First of all, writing and holding of data will be described. First, the potential of the fourth wiring is set to a potential which allows the transistor 162 to be turned on, whereby the transistor 162 is turned on. Accordingly, the potential of the third wiring is supplied to the gate electrode of the transistor 160 (writing). After that, the potential of the fourth wiring is set to a potential which allows the transistor 162 to be turned off, whereby the transistor 162 is turned off. Thus, the potential of the gate electrode of the transistor 160 is held (holding).

Since the off-state current of the transistor 162 is significantly small, the potential of the gate electrode of the transistor 160 is held for a long time. For example, when the potential of the gate electrode of the transistor 160 is a potential at which the transistor 160 is turned on, the on state of the transistor 160 is kept for a long time. Further, when the potential of the gate electrode of the transistor 160 is a potential which allows the transistor 160 to be turned off, the off state of the transistor 160 is kept for a long time.

Next, reading of data will be described. When a predetermined potential (a constant potential) is supplied to the first wiring in the state where the on state or the off state of the transistor 160 is kept as described above, the potential of the second wiring varies depending on whether the transistor 160 is on or off. For example, when the transistor 160 is on, the potential of the second wiring becomes lower than the potential of the first wiring. In contrast, when the transistor 160 is off, the potential of the second wiring is not changed.

In such a manner, the potential of the second wiring and a predetermined potential are compared with each other in a state where data is held, whereby the data can be read out.

Next, rewriting of data will be described. Rewriting of data is performed in a manner similar to that of the writing and holding of data. That is, the potential of the fourth wiring is set to a potential which allows the transistor 162 to be turned on, whereby the transistor 162 is turned on. Accordingly, the potential of the third wiring (a potential for new data) is supplied to the gate electrode of the transistor 160. After that, the potential of the fourth wiring is set to a potential which allows the transistor 162 to be turned off, whereby the transistor 162 is turned off. Thus, the new data is held.

In the semiconductor device according to one embodiment of the present invention, data can be directly rewritten by another writing of data as described above. For that reason, an erasing operation which is necessary for a flash memory or the like is not needed, and thus a reduction in operation speed due to an erasing operation can be suppressed. In other words, high-speed operation of the semiconductor device can be realized.

Note that although the operation of the memory cell 170 is described in this embodiment, operation of the memory cell 171 is similarly performed.

Note that an n-channel transistor in which electrons are majority carriers is used in the above description; it is needless to say that a p-channel transistor in which holes are majority carriers can be used instead of the n-channel transistor.

Note that the structure of the semiconductor device according to one embodiment of the present invention is not limited to that illustrated in FIGS. 1A and 1B. Since the technical idea of the disclosed invention is to form a stacked-layer structure with an oxide semiconductor and a material other than an oxide semiconductor, the details of connection relationship of electrodes or the like can be changed as appropriate.

<Example of Method for Manufacturing Semiconductor Device>

Next, an example of a method for manufacturing the semiconductor device will be described with reference to FIGS. 2A to 2D, FIGS. 3A to 3D, FIGS. 4A to 4C, and FIGS. 5A to 5C. First, a method for manufacturing the transistors 160 and 161 in the lower portion will be described with reference to FIGS. 2A to 2D and FIGS. 3A to 3D. Then, a method for manufacturing the transistors 162 and 163 in the upper portion will be described with reference to FIGS. 4A to 4C and FIGS. 5A to 5C.

<Method for Manufacturing Transistor in Lower Portion>

Figure 2A:
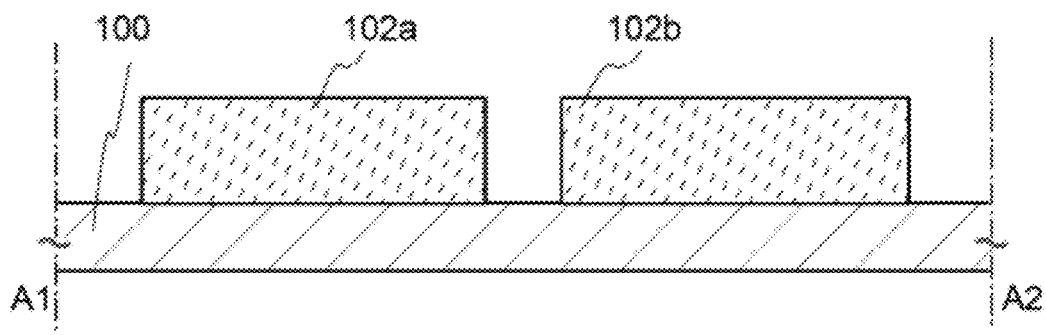
FIGS. 2A to 2D are cross-sectional views illustrating a manufacturing process of a semiconductor device.
Figure 2B:
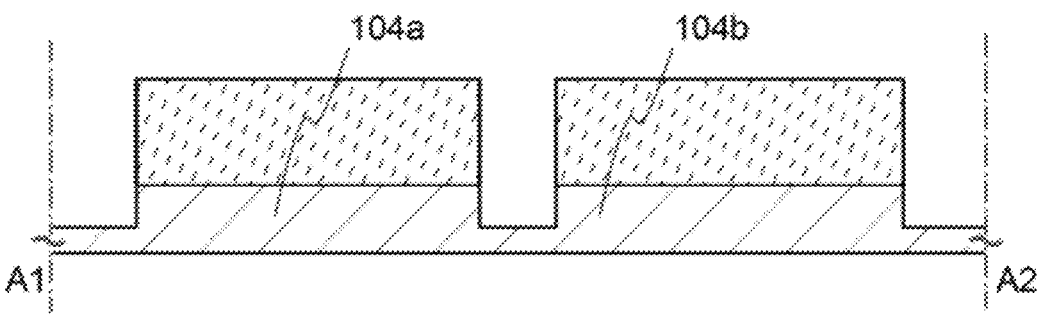

First, the substrate 100 including a semiconductor material is prepared (see FIG. 2A). A single crystal semiconductor substrate or a polycrystalline semiconductor substrate of silicon, silicon carbide, or the like, a compound semiconductor substrate of silicon germanium or the like, an SOI substrate, or the like can be used as the substrate 100 including a semiconductor material. Here, an example of the case where a single crystal silicon substrate is used as the substrate 100 including a semiconductor material is described. Note that the term "SOI substrate" generally means a substrate where a silicon semiconductor layer is provided over an insulating surface. In this specification and the like, the term "SOI substrate" also means a substrate where a semiconductor layer including a material other than silicon is provided over an insulating surface. That is, a semiconductor layer included in the "SOI substrate" is not limited to a silicon semiconductor layer. Moreover, the SOI substrate can be a substrate having a structure where a semiconductor layer is provided over an insulating substrate such as a glass substrate with an insulating layer sandwiched therebetween.

It is preferable that a single crystal semiconductor substrate of silicon or the like be particularly used as the substrate 100 including a semiconductor material because the speed of a reading operation of the semiconductor device can be increased.

Note that an impurity element may be added to regions which later serve as the channel formation region 116a of the transistor 160 and the channel formation region 116b of the transistor 161, in order to control the threshold voltages of the transistors. Here, an impurity element imparting conductivity is added so that the threshold voltage of the transistor 160 and the threshold voltage of the transistor 161 become positive. When the semiconductor material is silicon, the impurity imparting conductivity may be boron, aluminum, gallium, or the like. Note that it is preferable to perform heat treatment after an impurity element is added, in order to activate the impurity element or reduce defects which may be generated during addition of the impurity element.

A protective layer 102a and a protective layer 102b serving as masks for forming an element isolation insulating layer are formed over the substrate 100 (see FIG. 2A). As the protective layers 102a and 102b, an insulating layer formed using a material such as silicon oxide, silicon nitride, or silicon oxynitride can be used, for example.

Next, part of the substrate 100 in a region not covered with the protective layers 102a and 102b (i.e., in an exposed region) is removed by etching using the protective layers 102a and 102b as masks. Thus, a semiconductor region 104a and a semiconductor region 104b isolated from other semiconductor regions are formed (see FIG. 2B). As the etching, dry etching is preferably performed, but wet etching may be performed. An etching gas or an etchant can be selected as appropriate depending on a material to be etched. Note that the protective layers 102a and 102b are removed after the formation of the semiconductor regions 104a and 104b.

Figure 2C:
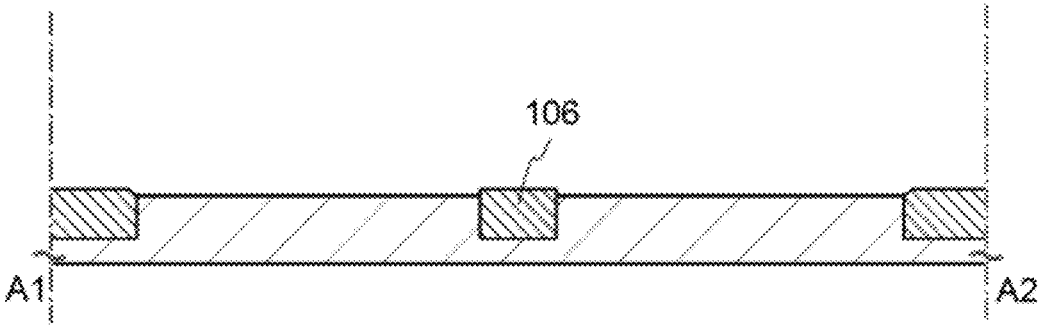

Then, an insulating layer is formed so as to cover the semiconductor regions 104a and 104b, and the insulating layer in a region overlapping with the semiconductor regions 104a and 104b is selectively removed; thus, the element isolation insulating layer 106 is formed (see FIG. 2C). The insulating layer is formed using silicon oxide, silicon nitride, silicon oxynitride, or the like. As a method for removing the insulating layer, any of etching treatment, polishing treatment such as chemical mechanical polishing (CMP), and the like can be employed.

Next, an insulating layer is formed over a surface of the semiconductor regions 104a and 104b, and a layer including a conductive material is formed over the insulating layer.

The insulating layer is processed into a gate insulating layer later and can be formed by heat treatment (thermal oxidation treatment, thermal nitridation treatment, or the like) of the surface of the semiconductor regions 104a and 104b, for example. Instead of heat treatment, high-density plasma treatment may be employed. The high-density plasma treatment can be performed using, for example, a mixed gas of any of a rare gas such as helium (He), argon (Ar), krypton (Kr), or xenon (Xe), oxygen, nitrogen oxide, ammonia, nitrogen, hydrogen, and the like. It is needless to say that the insulating layer may be formed by a CVD method, a sputtering method, or the like. The insulating layer preferably has a single-layer structure or a stacked-layer structure with a film including silicon oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, or the like. The insulating layer can have a thickness of greater than or equal to 1 nm and less than or equal to 100 nm, preferably, greater than or equal to 10 nm and less than or equal to 50 nm, for example.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of film formation methods such as an evaporation method, a CVD method, a sputtering method, or a spin coating method can be employed. Note that this embodiment shows an example of the case where the layer including a conductive material is formed using a metal material.

Figure 2D:
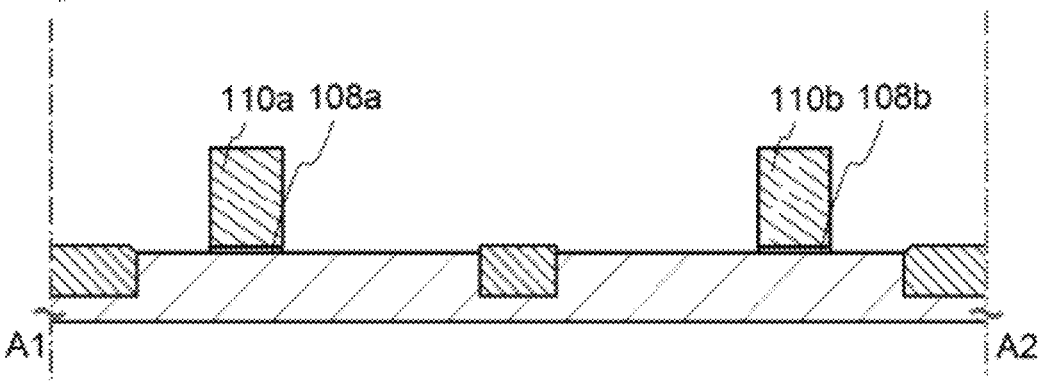

After that, the insulating layer and the layer including a conductive material are selectively etched; thus, the gate insulating layers 108a and 108b and the gate electrodes 110a and 110b are formed (see FIG. 2D).

Next, phosphorus (P), arsenic (As), or the like is added to the semiconductor regions 104a and 104b, whereby the channel formation regions 116a and 116b and the impurity regions 120a, 120b, 120c, and 120d are formed (see FIG. 3A). Note that phosphorus or arsenic is added here in order to form an n-type transistor; an impurity element such as boron (B) or aluminum (Al) may be added in the case of forming a p-type transistor.

Note that sidewall insulating layers may be formed on the side surfaces of the gate electrodes 110a and 110b, and impurity regions to which the impurity element is added at a different concentration may be formed.

Next, a metal layer 122 is formed so as to cover the gate electrodes 110a and 110b, the impurity regions 120a, 120b, 120c, and 120d, and the like (see FIG. 3B). The metal layer 122 can be formed by a variety of film formation methods such as a vacuum evaporation method, a sputtering method, and a spin coating method. The metal layer 122 is preferably formed using a metal material which forms a low-resistance metal compound by reacting with the semiconductor material included in the semiconductor regions 104a and 104b. Examples of such metal materials include titanium, tantalum, tungsten, nickel, cobalt, and platinum.

Next, heat treatment is performed so that the metal layer 122 reacts with the semiconductor material. Thus, the metal compound regions 124a, 124b, 124c, and 124d that are in contact with the impurity regions 120a, 120b, 120c, and 120d, respectively, are formed (see FIG. 3B). Note that when the gate electrodes 110a and 110b are formed using polycrystalline silicon or the like, metal compound regions are also formed in portions of the gate electrodes 110a and 110b which are in contact with the metal layer 122.

As the heat treatment, irradiation with a flash lamp can be employed, for example. Although it is needless to say that another heat treatment method may be used, a method by which heat treatment can be achieved in an extremely short time is preferably used in order to improve the controllability of chemical reaction for formation of the metal compound. Note that the metal compound regions are formed by reaction of the metal material and the semiconductor material and have sufficiently high conductivity. The formation of the metal compound regions can sufficiently reduce the electric resistance and improve element characteristics. Note that the metal layer 122 is removed after the metal compound regions 124a, 124b, 124c, and 124d are formed.

Next, the insulating layer 130 is formed so as to cover the components formed in the above steps (see FIG. 3C). The insulating layer 130 can be formed using an inorganic insulating material such as silicon oxide, silicon oxynitride, silicon nitride, or aluminum oxide. It is particularly preferable to use a low dielectric constant (low-k) material for the insulating layer 130 because capacitance due to overlap of electrodes or wirings can be sufficiently reduced. Note that a porous insulating layer with such a material may be employed as the insulating layer 130. The porous insulating layer has a lower dielectric constant than an insulating layer with high density and thus makes it possible to further reduce capacitance due to electrodes or wirings. Alternatively, the insulating layer 130 can be formed using an organic insulating material such as polyimide or acrylic. Note that although a single-layer structure of the insulating layer 130 is used in this embodiment, one embodiment of the present invention is not limited thereto. A stacked-layer structure including two or more layers can also be used.

Through the above steps, the transistors 160 and 161 are formed with the use of the substrate 100 including a semiconductor material (see FIG. 3C). A feature of the transistors 160 and 161 is that they can operate at high speed. With the use of the transistors as reading transistors of memory cells, data can be read at high speed.

After that, as treatment performed before the transistors 162 and 163 are formed, CMP treatment is performed on the insulating layer 130 so that upper surfaces of the gate electrodes 110a and 110b are exposed (see FIG. 3D). As treatment for exposing the upper surfaces of the gate electrodes 110a and 110b, etching treatment or the like can also be employed instead of CMP treatment; however, the surface of the insulating layer 130 is preferably made as flat as possible in order to improve characteristics of the transistors 162 and 163. For example, the insulating layer 130 is flattened so that the root-mean-square (RMS) roughness of the surface becomes 1 nm or less. This makes it possible to flatten the surface of an oxide semiconductor film formed over the insulating layer 130. With the use of the oxide semiconductor film, the characteristics of the transistors 162 and 163 can be improved.

Note that before or after each of the above steps, a step of forming an electrode, a wiring, a semiconductor layer, an insulating layer, or the like may be further performed. For example, when the wiring has a multi-layer structure of a stacked-layer structure including insulating layers and conductive layers, a highly integrated semiconductor device can be realized.

<Method for Manufacturing Transistor in Upper Portion>

Figure 4A:
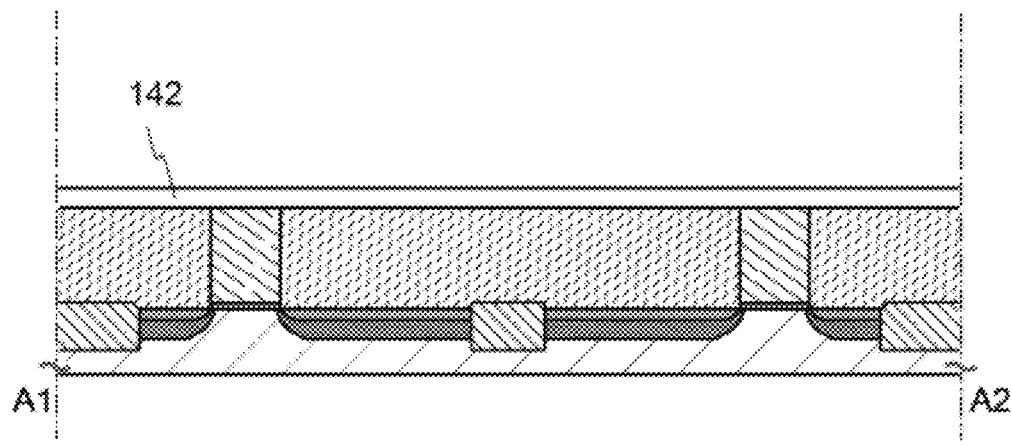
FIGS. 4A to 4C are cross-sectional views illustrating a manufacturing process of a semiconductor device.

After the surface of the insulating layer 130 is flattened as much as possible and the upper surfaces of the gate electrodes 110a and 110b are exposed, an oxide semiconductor layer 142 is formed (see FIG. 4A).

The oxide semiconductor layer 142 can be formed by a sputtering method, a molecular beam epitaxy method, an atomic layer deposition method, a pulsed laser deposition method, or the like.

As a material of the oxide semiconductor layer 142, the following can be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; an In—O-based oxide semiconductor, a Sn—O-based oxide semiconductor, or a Zn—O-based oxide semiconductor; or the like. In this specification, for example, an In—Sn—Ga—Zn—O-based oxide semiconductor means a metal oxide including indium (In), tin (Sn), gallium (Ga), and zinc (Zn), whose stoichiometric composition ratio is not particularly limited. The above oxide semiconductor may include silicon.

Alternatively, as the oxide semiconductor, an oxide semiconductor that can be expressed by a chemical formula, $InMO_3(ZnO)_m$ (m>0 and m is not necessarily a natural number) may be used. Here, M denotes one or more metal elements selected from Ga, Al, Mn, and Co.

As a target used for forming the oxide semiconductor layer 142, a target that can be expressed by a composition ratio of In:Ga:Zn=1:x:y (x is greater than or equal to 0 and y is greater than or equal to 0.5 and less than or equal to 5) is preferably used. For example, a target having a composition ratio of $In_2O_3:Ga_2O_3:ZnO=1:1:2$ [molar ratio] or the like can be used. Furthermore, a target having a composition ratio of $In_2O_3:Ga_2O_3:ZnO=1:1:1$ [molar ratio], a target having a composition ratio of $In_2O_3:Ga_2O_3:ZnO=1:1:4$ [molar ratio], or a target having a composition ratio of $In_2O_3:Ga_2O_3:ZnO=1:0:2$ [molar ratio] can also be used.

The relative density of the metal oxide in the target is 80% or more, preferably 95% or more, and more preferably 99.9% or more. The use of the target with high relative density makes it possible to form the oxide semiconductor layer 142 having a dense structure.

The atmosphere in which the oxide semiconductor layer 142 is formed is preferably an inert atmosphere, an oxidizing atmosphere, or a mixed atmosphere containing an inert gas and an oxidizing gas. The oxidizing atmosphere is an atmosphere that contains an oxidizing gas such as oxygen, ozone, or nitrogen dioxide as its main component and, preferably, does not contain water, hydrogen, and the like. For example, the purity of oxygen, ozone, or nitrogen dioxide to be introduced to a heat treatment apparatus is greater than or equal to 8N (99.999999%), preferably greater than or equal to 9N (99.9999999%) (i.e., the impurity concentration is lower than or equal to 1 ppm, preferably lower than 0.1 ppm). As the oxidizing atmosphere, an oxidizing gas and an inert gas may be mixed to be used. In that case, the mixture contains an oxidizing gas at a concentration of at least greater than or equal to 10 ppm. Further, an inert atmosphere is an atmosphere that contains an inert gas such as nitrogen or a rare gas (e.g., helium, neon, argon, krypton, or xenon) as its main component. For example, the purity of an inert gas to be introduced to a heat treatment apparatus is greater than or equal to 6N (99.9999%), preferably greater than or equal to 7N (99.99999%) (i.e., the impurity concentration is lower than or equal to 1 ppm, preferably lower than or equal to 0.1 ppm). Specifically, the concentration of a reactive gas such as an oxidizing gas is lower than 10 ppm.

In forming the oxide semiconductor layer 142 by a sputtering method, for example, an object to be processed is held in a treatment chamber that is maintained under reduced pressure, and the object to be processed is heated to a temperature higher than or equal to 100° C. and lower than 550° C., preferably higher than or equal to 200° C. and lower than or equal to 400° C. Alternatively, the temperature of an object to be processed in forming the oxide semiconductor layer 142 may be room temperature. Then, moisture in the treatment chamber is removed, a sputtering gas from which hydrogen, water, or the like is removed is introduced, and the above-described target is used; thus, the oxide semiconductor layer 142 is formed. By forming the oxide semiconductor layer 142 while the object to be processed is heated, an impurity in the oxide semiconductor layer 142, such as hydrogen or water, can be reduced. Moreover, damage due to sputtering can be reduced. In order to remove the moisture in the treatment chamber, it is preferable to use an entrapment vacuum pump. For example, a cryopump, an ion pump, a titanium sublimation pump, or the like can be used. A turbo-molecular pump provided with a cold trap may be used. Since an impurity such as hydrogen or water can be removed from the treatment chamber evacuated with a cryopump or the like, the concentration of an impurity in the oxide semiconductor layer 142 can be reduced.

In the case where the oxide semiconductor layer 142 is formed by a sputtering method, for example, the following conditions can be set: the distance between the object to be processed and the target is 170 mm; the pressure is 0.4 Pa; the direct current (DC) power is 0.5 kW; and the atmosphere is an oxygen (100% oxygen) atmosphere, an argon (100% argon) atmosphere, or a mixed atmosphere of oxygen and argon. Note that a pulsed direct current (DC) power source is preferably used because particles (such as powder substances generated in film formation) can be reduced and the film thickness can be uniform. The thickness of the oxide semiconductor layer 142 is greater than or equal to 1 nm and less than or equal to 50 nm, preferably greater than or equal to 1 nm and less than or equal to 30 nm, more preferably greater than or equal to 1 nm and less than or equal to 10 nm. The use of the oxide semiconductor layer 142 of such a thickness makes it possible to suppress a short channel effect which is caused by miniaturization. Note that the appropriate thickness of the oxide semiconductor layer 142 differs depending on the oxide semiconductor material to be used, the intended use of the semiconductor device, or the like; therefore, the thickness can be determined as appropriate in accordance with the material, the intended use, or the like.

Note that before the oxide semiconductor layer 142 is formed by a sputtering method, reverse sputtering in which plasma is generated with an argon gas introduced is preferably performed so that a material attached to a surface where the oxide semiconductor layer 142 is to be formed (e.g., a surface of the insulating layer 130) is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface side in an argon atmosphere so that plasma is generated near the object to be processed. Note that an atmosphere of nitrogen, helium, oxygen, or the like may be used instead of an argon atmosphere.

The oxide semiconductor layer 142 is in a single crystal state, a polycrystalline (also referred to as polycrystal) state, an amorphous state, or the like.

The oxide semiconductor layer 142 is preferably a CAAC-OS (c-axis aligned crystalline oxide semiconductor) layer.

The CAAC-OS layer is not completely single crystal nor completely amorphous. The CAAC-OS layer is an oxide semiconductor layer with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS layer is not clear. Further, with the TEM, a grain boundary in the CAAC-OS layer is not found. Thus, in the CAAC-OS layer, a reduction in electron mobility, due to the grain boundary, is suppressed.

In each of the crystal parts included in the CAAC-OS layer, a c-axis is aligned in a direction parallel to a normal vector of a surface where the CAAC-OS layer is formed or a normal vector of a surface of the CAAC-OS layer, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS layer, distribution of crystal parts is not necessarily uniform. For example, in the formation process of the CAAC-OS layer, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS layer, the crystal part in a region to which the impurity is added becomes amorphous in some cases.

Since the c-axes of the crystal parts included in the CAAC-OS layer are aligned in the direction parallel to a normal vector of a surface where the CAAC-OS layer is formed or a normal vector of a surface of the CAAC-OS layer, the directions of the c-axes may be different from each other depending on the shape of the CAAC-OS layer (the cross-sectional shape of the surface where the CAAC-OS layer is formed or the cross-sectional shape of the surface of the CAAC-OS layer). Note that when the CAAC-OS layer is formed, the direction of c-axis of the crystal part is the direction parallel to a normal vector of the surface where the CAAC-OS layer is formed or a normal vector of the surface of the CAAC-OS layer. The crystal part is formed by film formation or by performing treatment for crystallization such as heat treatment after film formation.

With use of the CAAC-OS layer in a transistor, change in electric characteristics of the transistor due to irradiation with visible light or ultraviolet light can be reduced. Thus, the transistor has high reliability.

Note that part of oxygen included in the oxide semiconductor layer may be substituted with nitrogen.

The case where the oxide semiconductor layer 142 is a CAAC-OS layer is described here. The oxide semiconductor layer 142 is formed over the insulating layer 130 by a sputtering method, a molecular beam epitaxy method, an atomic layer deposition method, or a pulsed laser deposition method. Note that the proportion of crystal portions to an amorphous region in the oxide semiconductor layer 142 can be increased by heating an object to be heated in film formation. For example, the substrate temperature may be higher than or equal to 150° C. and lower than or equal to 450° C. Preferably, the substrate temperature is higher than or equal to 200° C. and lower than or equal to 350° C. By raising the substrate temperature in such a manner, the proportion of crystal portions included in the oxide semiconductor layer 142 can be increased.

Next, first heat treatment may be performed after the oxide semiconductor layer 142 is formed. The first heat treatment can increase the proportion of crystal portions to an amorphous region in the oxide semiconductor layer 142. The first heat treatment may be performed at a temperature higher than or equal to 200° C. and lower than the strain point of the substrate. Preferably, the first heat treatment is performed at a temperature higher than or equal to 250° C. and lower than or equal to 450° C. There is no limitation on the atmosphere in which the first heat treatment is performed, and the first heat treatment is performed in an oxidizing atmosphere, an inert atmosphere, or a reduced-pressure atmosphere. The treatment time is from 3 minutes to 24 hours. The proportion of crystal portions to an amorphous region in the oxide semiconductor layer 142 can be increased as the treatment time is prolonged. However, a heat treatment time longer than 24 hours is not preferable because productivity is decreased. In addition, after the oxide semiconductor layer 142 is formed, through the first heat treatment, excess hydrogen (including water or a hydroxyl group) in the oxide semiconductor layer 142 can be removed, the structure of the oxide semiconductor layer 142 can be ordered, and defect states in an energy gap can be reduced.

The heat treatment apparatus is not limited to the electric furnace and may be an apparatus for heating an object to be processed by thermal radiation or thermal conduction from a medium, such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, GRTA treatment may be performed as follows. The object to be processed is put in a heated inert gas atmosphere, heated for several minutes, and taken out of the inert gas atmosphere. The GRTA treatment enables high-temperature heat treatment in a short time. Moreover, the GRTA treatment can be employed even when the temperature exceeds the upper temperature limit of the object to be processed. Note that the inert gas may be switched to a gas including oxygen during the treatment. This is because defect states in an energy gap caused by oxygen deficiency can be reduced by performing the first heat treatment in an atmosphere including oxygen.

In any case, the oxide semiconductor layer 142 which is an i-type (intrinsic) or substantially i-type oxide semiconductor layer obtained by reducing an impurity through the first heat treatment can be formed. In addition, the proportion of crystal portions to an amorphous region in the oxide semiconductor layer 142 can be increased. With the use of the oxide semiconductor layer 142 described above, a transistor with extremely excellent characteristics can be realized.

Figure 4B:
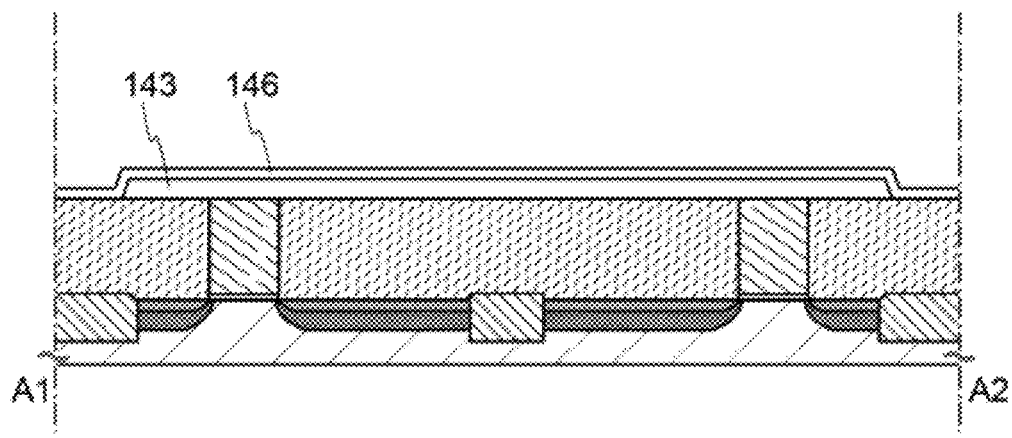

Next, the oxide semiconductor layer 142 is selectively etched, whereby the island-like oxide semiconductor layer 143 is formed, and then the gate insulating layer 146 is formed so as to cover the oxide semiconductor layer 143 (see FIG. 4B).

At least one of wet etching and dry etching can be employed for etching of the oxide semiconductor layer 142.

The gate insulating layer 146 can be formed by a CVD method, a sputtering method, or the like. The gate insulating layer 146 is preferably formed so as to contain silicon oxide, silicon nitride, silicon oxynitride, aluminum oxide, tantalum oxide, hafnium oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, or the like. The gate insulating layer 146 may have a single-layer structure or a stacked-layer structure. There is no particular limitation on the thickness of the gate insulating layer 146; the thickness is preferably small in order to ensure the operation of the transistor when the semiconductor device is miniaturized. For example, in the case of using silicon oxide, the thickness can be greater than or equal to 1 nm and less than or equal to 100 nm, preferably greater than or equal to 10 nm and less than or equal to 50 nm.

When the gate insulating layer is thin as described above, gate leakage due to a tunnel effect or the like becomes a problem. In order to solve the problem of gate leakage, the gate insulating layer 146 may be formed using a high dielectric constant (high-k) material such as hafnium oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, or hafnium aluminate (HfAl$_x$O$_y$ (x>0, y>0)) to which nitrogen is added. The use of a high-k material for the gate insulating layer 146 makes it possible to increase the thickness in order to suppress gate leakage as well as to ensure electric characteristics. Note that a stacked-layer structure of a film including a high-k material and a film including any of silicon oxide, silicon nitride, silicon oxynitride, silicon nitride oxide, aluminum oxide, and the like may also be employed.

After the gate insulating layer 146 is formed, second heat treatment may be performed in an inert gas atmosphere, an oxygen atmosphere, or a mixed atmosphere of an inert gas and an oxidizing gas. The temperature of the heat treatment is higher than or equal to 200° C. and lower than or equal to 450° C., preferably higher than or equal to 250° C. and lower than or equal to 350° C. For example, the heat treatment may be performed at 250° C. in a nitrogen atmosphere for one hour. By the second heat treatment, variation in electric characteristics of the transistor can be reduced. In the case where the gate insulating layer 146 contains oxygen, oxygen can be supplied to the oxide semiconductor layer 143 and oxygen deficiency in the oxide semiconductor layer 143 can be filled; thus, the oxide semiconductor layer 143 which is an i-type (intrinsic) or substantially i-type oxide semiconductor layer can be formed.

Note that the second heat treatment is performed in this embodiment after the gate insulating layer 146 is formed; there is no particular limitation on the timing of the second heat treatment. For example, the second heat treatment may be performed after the gate electrode is formed. Alternatively, the first heat treatment and the second heat treatment may be performed in succession, or the first heat treatment may double as the second heat treatment, or the second heat treatment may double as the first heat treatment.

Figure 4C:
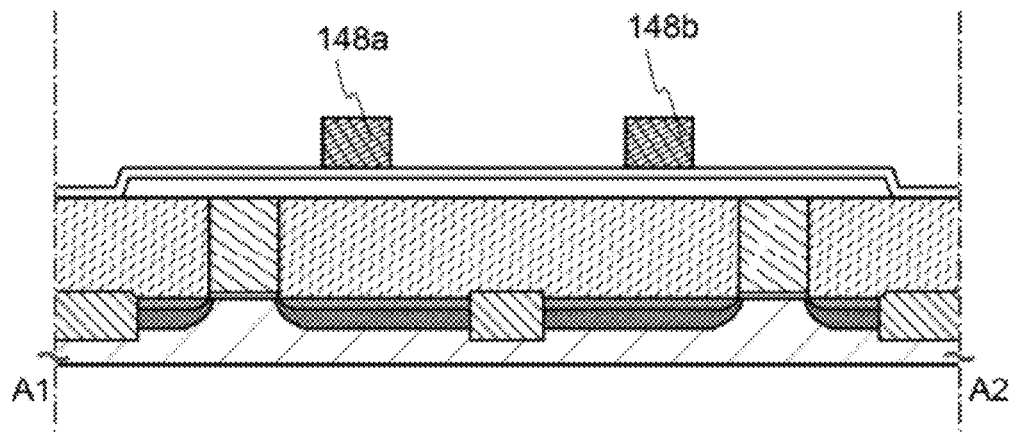

Next, after a layer including a conductive material is formed over the gate insulating layer 146, the layer including a conductive material is selectively etched, whereby the gate electrodes 148a and 148b are formed (see FIG. 4C). As for details, a method or a material similar to that of the gate electrodes 110a and 110b and the like can be employed to form the gate electrodes 148a and 148b.

Further, an In—Ga—Zn—O—N-based compound conductor can be used for the gate electrodes 148a and 148b. An In—Ga—Zn—O—N-based compound conductive layer can be formed by sputtering, using the In—Ga—Zn—O—N-based compound conductor as a sputtering target.

The thickness of the In—Ga—Zn—O—N-based compound conductor is preferably greater than or equal to 10 nm and less than or equal to 50 nm. As the sputtering target of the In—Ga—Zn—O—N-based compound conductor, for example, a sputtering target having the composition ratio of In:Ga:Zn=1:1:1 [molar ratio], where the ratio of oxygen to nitrogen is 7:1, can be used. Note that the composition of the sputtering target is not necessarily limited to the above. For example, a sputtering target having a composition ratio of In:Ga:Zn=1:1:2 [molar ratio] can also be used.

The atmosphere of film formation is preferably a rare gas (typically, argon) or a mixed atmosphere of a rare gas and nitrogen, and the total percentage of argon, krypton, and xenon in the atmosphere is preferably 80% or more in order to increase the deposition rate. The concentration of oxygen in the atmosphere is preferably 5% or lower.

An example of the film formation conditions is as follows: the distance between the substrate and the sputtering target is 60 mm; the pressure is 0.4 Pa; the direct-current (DC) power is 0.5 kW; and the film formation atmosphere is a mixed atmosphere containing argon and nitrogen (the proportion of the nitrogen flow is 12.5%).

In the case where the In—Ga—Zn—O—N-based compound conductor is used for the gate electrodes 148a and 148b, a stacked-layer structure is preferable. For example, a conductive layer is preferably formed over the In—Ga—Zn—O—N-based compound conductor layer, using one or more of a metal material such as molybdenum, titanium, tantalum, tungsten, aluminum, copper, neodymium, or scandium, nitride of any of these metal materials, or an alloy material which contains any of these metal materials as its main component.

After the conductive layer is formed over the In—Ga—Zn—O—N-based compound conductive layer, using the above metal material, the conductive layer is etched into a desired shape, whereby the gate electrodes 148a and 148b can be formed (see FIG. 4C).

Figure 5A:
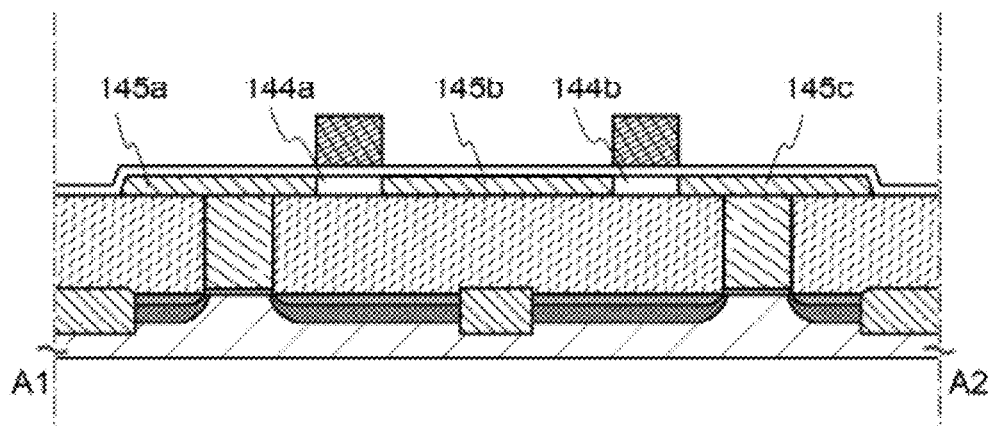
FIGS. 5A to 5C are cross-sectional views illustrating a manufacturing process of a semiconductor device.

Next, the low-resistance regions 145a, 145b, and 145c are formed in a self-aligned manner by adding an impurity element to the oxide semiconductor layer 143 through the gate insulating layer 146, using the gate electrodes 148a and 148b as masks (see FIG. 5A). Note that regions to which an impurity element is not added serve as the channel formation regions 144a and 144b. The resistance of the regions to which an impurity element is added is lower than that of the regions to which an impurity element is not added; therefore, the regions to which an impurity is added are referred to as the low-resistance regions. In addition, in the case where the regions to which an impurity element is added show n-type conductivity by the addition of the impurity element, such regions are also referred to as n-type regions or simply as impurity regions. Further, such regions are each referred to as a source region or a drain region in some cases.

As the impurity element, nitrogen (N), phosphorus (P), arsenic (As), antimony (Sb), argon (Ar), or the like which is an element belonging to Group V (Group 15) can be used. In this embodiment, an example in which nitrogen is injected is shown.

As a method for injecting an impurity element, an ion implantation method, an ion doping method, or the like can be used. In an ion implantation method, a source gas is made into plasma, ion species included in this plasma are extracted and mass-separated, and ion species with predetermined mass are accelerated and implanted into an object to be processed as an ion beam. In an ion doping method, a source gas is made into plasma, ion species are extracted from this plasma by operation of a predetermined electric field, and the extracted ion species are accelerated without mass separation and implanted into an object to be processed as an ion beam. When the injection of nitrogen is performed using an ion implantation method involving mass-separation, an element other than the desired impurity element (here, nitrogen), such as a metal element, can be prevented from being added to an oxide semiconductor. On the other hand, an ion doping method enables ion-beam irradiation to a larger area than an ion implantation method, and therefore, when the addition of an impurity element is performed using an ion doping method, the takt time can be shortened.

Further, the nitrogen concentration of the low-resistance regions 145a, 145b, and 145c is preferably higher than or equal to $5 \times 10^{18}$ atoms/cm$^3$ and lower than $5 \times 10^{21}$ atoms/cm$^3$. Note that the above nitrogen concentration of the low-resistance regions 145a, 145b, and 145c was measured by secondary ion mass spectroscopy (SIMS).

When the nitrogen concentration of the above low-resistance regions 145a, 145b, and 145c is higher than or equal to $5 \times 10^{20}$ atoms/cm$^3$ and lower than 7 atomic % to perform heat treatment at a temperature higher than or equal to 300° C. and lower than or equal to 600° C., the crystal structure of the low-resistance regions 145a, 145b, and 145c is likely to be a wurtzite structure.

As one of manufacturing methods for impurity regions serving as a source region and a drain region in a self-aligned manner in a transistor including an oxide semiconductor, a method is disclosed in which a surface of an oxide semiconductor layer is exposed, argon plasma treatment is performed, and the resistivity of a region of the oxide semiconductor layer, which is exposed to the plasma, is reduced (S. Jeon et al. "180 nm Gate Length Amorphous InGaZnO Thin Film Transistor for High Density Image Sensor Application", *IEDM Tech. Dig.*, pp. 504-507, 2010).

However, in the above manufacturing method, it is necessary to remove the gate insulating layer partly so that portions to be a source region and a drain region are exposed after the gate insulating layer is formed. Thus, when the gate insulating layer is removed, the oxide semiconductor layer placed below the gate insulating layer is also partly over-etched; therefore, the thickness of the portions to be a source region and a drain region is reduced. As a result, the resistance of the source region or drain region is likely to be increased, and defective characteristics of the transistor are likely to occur due to over-etching.

In order to promote higher definition of the transistor, it is necessary to employ a dry etching method with high processing accuracy. However, the above over-etching is likely to occur remarkably in the case of employing a dry etching method by which the selectivity of the oxide semiconductor layer with respect to the gate insulating layer cannot be secured sufficiently.

For example, the problem of over-etching does not arise when the oxide semiconductor layer has a sufficient thickness. However, when the channel length is to be shorter than or equal to 200 nm, the thickness of the portion of the oxide semiconductor layer to be a channel formation region needs to be less than or equal to 20 nm, preferably less than or equal to 10 nm so as to prevent short-channel effect. When the thickness of the oxide semiconductor layer is small as in the above case, the resistance of the source region or the drain region is increased and defective characteristics of the transistor occur due to over-etching of the oxide semiconductor layer as described above, which is not preferable.

However, as in one embodiment of the present invention, an impurity element is added to the oxide semiconductor layer 143 without exposure of the oxide semiconductor layer 143 while the gate insulating layer 146 is left, whereby the oxide semiconductor layer 143 is prevented from being over-etched and excessive damage to the oxide semiconductor layer 143 can be reduced. Additionally, the interface between the oxide semiconductor layer 143 and the gate insulating layer 146 is kept clean. Thus, the characteristics and the reliability of the transistor can be improved.

Figure 5B:
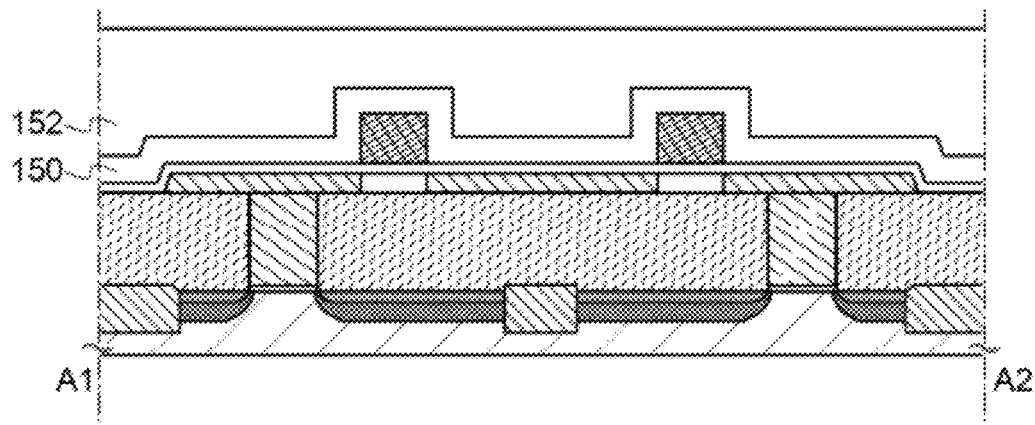

Next, the interlayer insulating layers 150 and 152 are formed over the gate insulating layer 146, the gate electrode 148a, and the gate electrode 148b (see FIG. 5B). The interlayer insulating layers 150 and 152 can be formed by a PVD method, a CVD method, or the like. The interlayer insulating layers 150 and 152 can be formed using a material including an inorganic insulating material such as silicon oxide, silicon oxynitride, silicon nitride, hafnium oxide, aluminum oxide, or tantalum oxide. Note that although a stacked-layer structure of the interlayer insulating layers 150 and 152 is used in this embodiment, one embodiment of the present invention is not limited thereto. A single-layer structure or a stacked-layer structure including three or more layers can also be used. Alternatively, a structure in which the interlayer insulating layers are not provided is also possible.

Note that the interlayer insulating layer 152 is preferably formed so as to have a flat surface. This is because when the interlayer insulating layer 152 has a flat surface, an electrode, a wiring, or the like can be favorably formed over the interlayer insulating layer 152 even in the case where the semiconductor device or the like is miniaturized. Note that the interlayer insulating layer 152 can be planarized using a method such as chemical mechanical polishing (CMP).

Next, an opening reaching the oxide semiconductor layer 143 is formed by selectively etching the interlayer insulating layers 150 and 152 and the gate insulating layer 146. After that, a conductive layer is formed over the interlayer insulating layer 152 and selectively etched, whereby the wiring 156 is formed (see FIG. 5C). Accordingly, the wiring 156 and the oxide semiconductor layer 143 can be connected to each other. The wiring 156 serves as the other of the source electrode and the drain electrode of the transistor 162 and serves as the other of the source electrode and the drain electrode of the transistor 163.

Figure 5C:
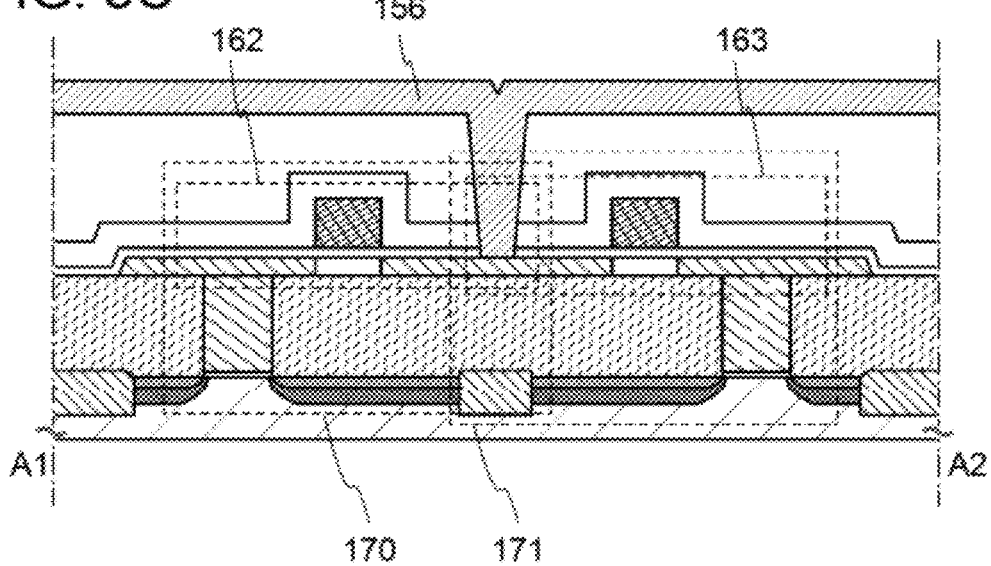

Through the above steps, the transistors 162 and 163 can be formed over the transistors 160 and 161 (see FIG. 5C). Accordingly, the memory cell 170 including the transistors 160 and 162 and the memory cell 171 including the transistors 161 and 163 can be formed.

Note that in this embodiment, the case where the two transistors are connected to each other is described; however, one embodiment of the present invention is not limited thereto and three or more transistors can be connected to one another.

The structures, methods, and the like described in this embodiment can be combined as appropriate with any of the structures, methods, and the like described in the other embodiments.

Embodiment 2

In this embodiment, a semiconductor device partly different from the semiconductor device shown in the above embodiment is described with reference to FIGS. 6A and 6B and FIGS. 7A to 7D. Note that in this embodiment, only different portions from the above embodiment will be described.

<Example of Structure of Semiconductor Device>

Figure 6A:
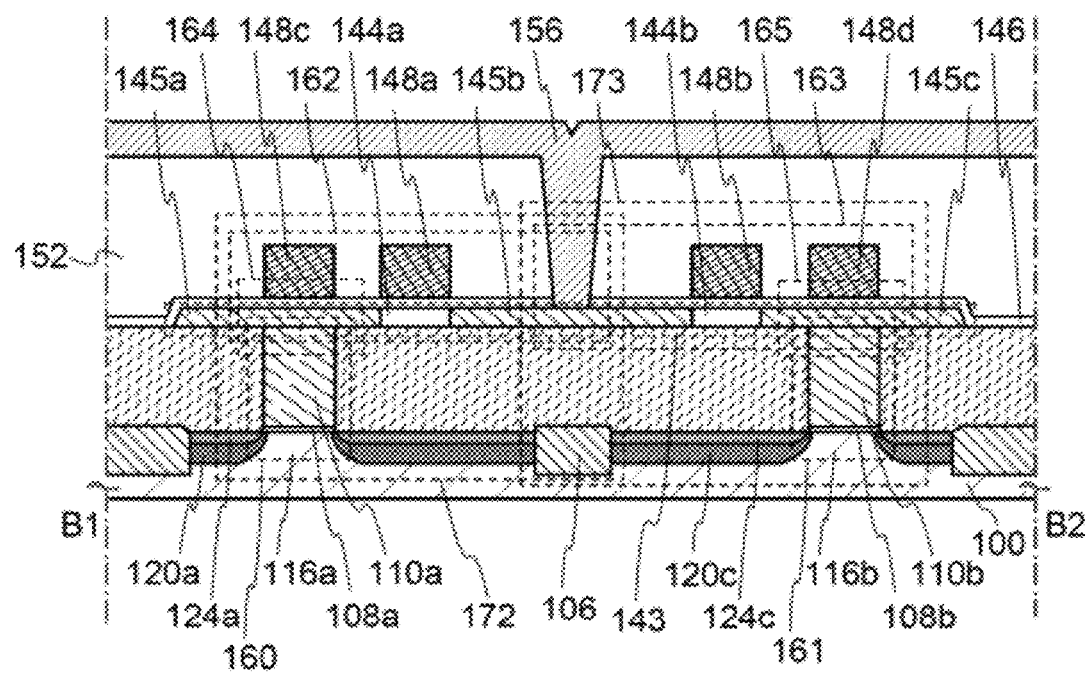
FIGS. 6A and 6B are a cross-sectional view and a circuit diagram, respectively, of a semiconductor device.
Figure 6B:
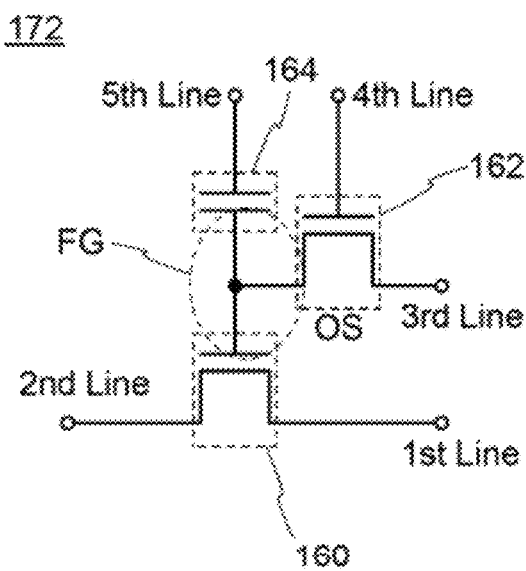

FIG. 6A is a cross-sectional view of the semiconductor device, and FIG. 6B is a circuit diagram of the semiconductor device. The semiconductor device in FIGS. 6A and 6B can also be used as a memory device.

The semiconductor device illustrated in FIG. 6A includes, in a lower portion, the transistors 160 and 161, and in an upper portion, the transistors 162 and 163, a capacitor 164, and a capacitor 165. In addition, the transistors 160 and 162 and the capacitor 164 can form a memory cell 172, and the transistors 161 and 163 and the capacitor 165 can form a memory cell 173.

The capacitor 164 includes the gate electrode 110a, the oxide semiconductor layer 143, the gate insulating layer 146, and an electrode 148c. Here, the gate electrode 110a serves as one electrode of the capacitor 164, and the electrode 148c serves as the other electrode of the capacitor 164. The capacitor 165 includes the gate electrode 110b, the oxide semiconductor layer 143, the gate insulating layer 146, and an electrode 148d. Here, the gate electrode 110b serves as one electrode of the capacitor 165, and the electrode 148d serves as the other electrode of the capacitor 165.

As illustrated in FIG. 6A, the gate electrode 110a of the transistor 160 serves as one of the source electrode and the drain electrode of the transistor 162, whereby one of the source electrode and the drain electrode of the transistor 162 does not need to be connected to another wiring through an opening in the interlayer insulating layer 152. In addition, the transistors 162 and 163 are formed using one oxide semiconductor layer, the oxide semiconductor layer 143. Further, the transistors 162 and 163 are connected to each other by sharing the wiring 156 serving as a source electrode and a drain electrode. Further, in adjacent memory cells, the other of the source electrode and the drain electrode of the transistor 162 and the other of the source electrode and the drain electrode of the transistor 163, which include the oxide semiconductor layer 143, can be electrically connected to each other.

Through the above steps, the area occupied by the memory cells 172 and 173 can be reduced, whereby the degree of integration of a semiconductor device can be enhanced and the storage capacity per unit area can be increased.

Next, a circuit diagram of the memory cell 172 in FIG. 6A is illustrated in FIG. 6B.

In the memory cell 172 illustrated in FIG. 6B, a first wiring (a first line) is electrically connected to the source electrode of the transistor 160, and a second wiring (a second line) is electrically connected to the drain electrode of the transistor 160. A third wiring (a third line) is electrically connected to the other of the source electrode and the drain electrode of the transistor 162, and a fourth wiring (a fourth line) is electrically connected to the gate electrode of the transistor 162. The gate electrode of the transistor 160 and one of the source electrode and the drain electrode of the transistor 162 are electrically connected to one electrode of the capacitor 164, and a fifth wiring (a fifth line, also referred to as a third signal line) and the other electrode of the capacitor 164 are electrically connected to each other.

By utilizing a feature in which the potential of the gate electrode of the transistor 160 can be held, data can be written, held, and read as follows. The operation of the memory cell 172 will be described below.

First of all, writing and holding of data will be described. First, the potential of the fourth wiring is set to a potential which allows the transistor 162 to be turned on, whereby the transistor 162 is turned on. Accordingly, the potential of the third wiring is supplied to the gate electrode of the transistor 160 and the capacitor 164. That is, predetermined electric charge is given to the gate electrode of the transistor 160 (writing). Here, one of electric charges for supply of two different potentials (hereinafter, an electric charge for supply of a low potential is referred to as an electric charge $Q_L$ and an electric charge for supply of a high potential is referred to as an electric charge $Q_H$) is given to the gate electrode of the transistor 160. Note that electric charges giving three or more different potentials may be applied to improve a storage capacitor. After that, the potential of the fourth wiring is set to a potential which allows the transistor 162 to be turned off, whereby the transistor 162 is turned off. Thus, the electric charge applied to the gate electrode of the transistor 160 is held (holding).

Since the off-state current of the transistor 162 is significantly small, the electric charge of the gate electrode of the transistor 160 is held for a long time.

Next, reading of data will be described. By supplying an appropriate potential (reading potential) to the fifth wiring while a predetermined potential (constant potential) is supplied to the first wiring, the potential of the second wiring varies depending on the amount of electric charge held in the gate electrode of the transistor 160. This is generally because, when the transistor 160 is an n-channel transistor and $Q_H$ is larger than $Q_L$, the apparent threshold voltage $V_{th\_H}$ of the transistor 160 in the case where $Q_H$ is given to the gate electrode of the transistor 160 is lower than the apparent threshold voltage $V_{th\_L}$ of the transistor 160 in the case where $Q_L$ is given to the gate electrode of the transistor 160. Here, an apparent threshold voltage refers to the potential of the fifth wiring, which is needed to turn on the transistor 160. Thus, the potential of the fifth wiring is set to a potential $V_0$ intermediate between $V_{th\_H}$ and $V_{th\_L}$, whereby electric charge given to the gate electrode of the transistor 160 can be determined. For example, in the case where $Q_H$ is given in writing, when the potential of the fifth wiring is set to $V_0$ ($>V_{th\_H}$), the transistor 160 is turned on. In the case where $Q_L$ is given in writing, even when the potential of the fifth wiring is set to $V_0$ ($<V_{th\_L}$), the transistor 160 remains in an off state. Therefore, the stored data can be read by comparing the potential of the second wiring with a predetermined potential.

Note that in the case where memory cells are arrayed to be used, only data of desired memory cells is needed to be read. Thus, in the case where data of predetermined memory cells is read and data of the other memory cells is not read, a potential which allows the transistor 160 to be turned off regardless of a state of the gate electrode, that is, a potential lower than $V_{th\_H}$ may be applied to fifth wirings of the memory cells whose data is not to be read. Alternatively, a potential which allows the transistor 160 to be turned on regardless of a state of the gate electrode, that is, a potential higher than $V_{th\_L}$ may be applied to the fifth wirings.

Next, rewriting of data will be described. Rewriting of data is performed in a manner similar to that of the writing and holding of data. That is, the potential of the fourth wiring is set to a potential which allows the transistor 162 to be turned on, whereby the transistor 162 is turned on. Accordingly, the potential of the third wiring (a potential related to new data) is supplied to the gate electrode of the transistor 160 and the capacitor 164. After that, the potential of the fourth wiring is set to a potential which allows the transistor 162 to be turned off, whereby the transistor 162 is turned off. Thus, the new data is held in the gate electrode of the transistor 160.

In the semiconductor device according to one embodiment of the present invention, data can be directly rewritten by another writing of data as described above. For that reason, extraction of electric charge from a floating gate with the use of a high voltage which is necessary for a flash memory or the like is not needed, and thus a reduction in operation speed due to an erasing operation can be suppressed. In other words, high-speed operation of the semiconductor device can be achieved.

Note that one of the source electrode and the drain electrode of the transistor 162 is electrically connected to the gate electrode of the transistor 160 and therefore has a function similar to that of a floating gate of a floating gate transistor used for a nonvolatile memory element. Therefore, a portion in the drawing where one of the source electrode and the drain electrode of the transistor 162 is electrically connected to the gate electrode of the transistor 160 is called a floating gate portion FG in some cases. When the transistor 162 is turned off, the floating gate portion FG can be regarded as being embedded in an insulator and thus electric charge is held at the floating gate portion FG. The off-state current of the transistor 162 including an oxide semiconductor is smaller than or equal to 1/100000 of the off-state current of a transistor including silicon or the like; thus, loss of the electric charge accumulated in the floating gate portion FG due to leakage in the transistor 162 is negligible. That is, with the transistor 162 including an oxide semiconductor, a nonvolatile memory device which can hold data without being supplied with power can be obtained.

<Example of Method for Manufacturing Semiconductor Device>

Next, a method for manufacturing the semiconductor device illustrated in FIGS. 6A and 6B will be described with reference to FIGS. 7A to 7D. Note that steps up to the step of forming the insulating layer 130 are the same as the steps in Embodiment 1; therefore, the detailed descriptions are omitted here.

Next, the oxide semiconductor layer 142 is formed over the insulating layer 130 and the gate electrodes 110a and 110b. After that, the oxide semiconductor layer 142 is selectively etched, whereby the island-like oxide semiconductor layer 143 is formed, and then the gate insulating layer 146 is formed so as to cover the oxide semiconductor layer 143 (see FIG. 7A). Note that steps up to this step are similar to the steps up to the step illustrated in FIG. 4B; therefore, the detailed descriptions are omitted here.

Figure 7A:
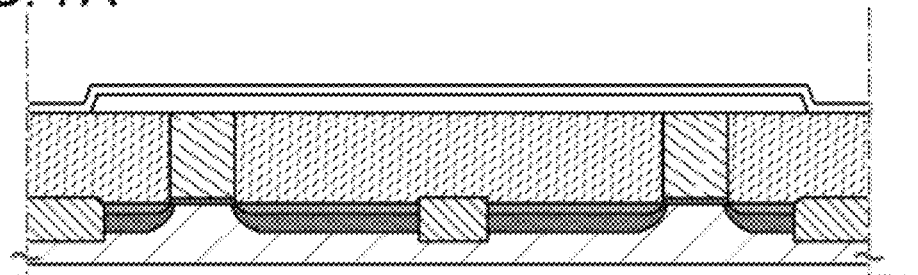
FIGS. 7A to 7D are cross-sectional views illustrating a manufacturing process of a semiconductor device.
Figure 7B:
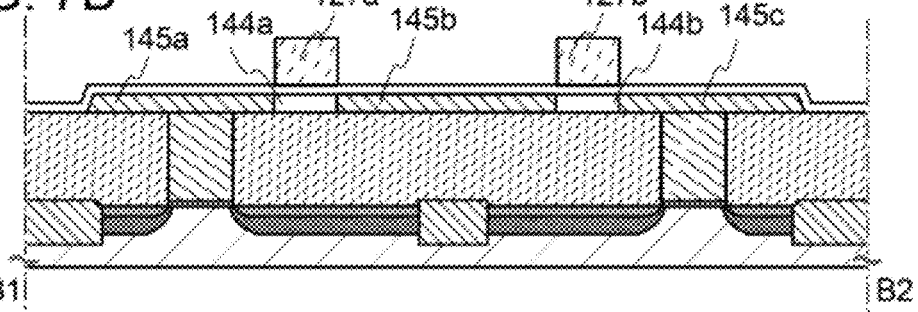

Next, after a masks 127a and a mask 127b are formed over the gate insulating layer 146, the channel formation regions 144a and 144b as well as the low-resistance regions 145a, 145b, and 145c are formed by adding an impurity element to the oxide semiconductor layer 143 through the gate insulating layer 146 (see FIG. 7B). As the masks formed over the gate insulating layer 146, resist masks or the like can be used. For the method for adding an impurity element or the like, description of FIG. 5A can be referred to. Note that the masks 127a and 127b are removed after an impurity element is added.

Figure 7C:
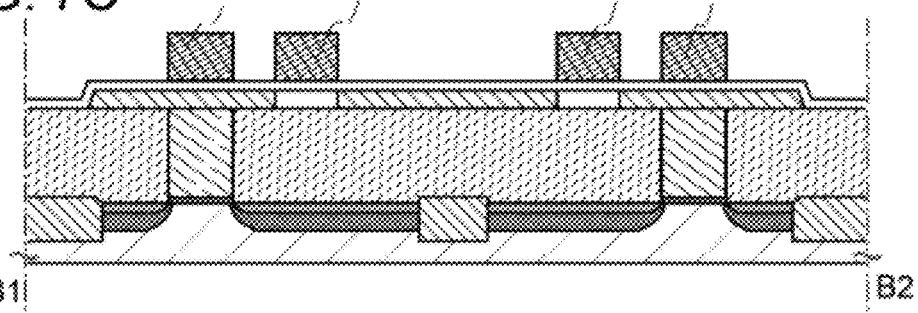

Next, after a layer including a conductive material is formed over the gate insulating layer 146, the layer including a conductive material is selectively etched, whereby the gate electrodes 148a and 148b, and the electrodes 148c and 148d are formed (see FIG. 7C). The electrode 148c serves as one electrode of the capacitor 164, and the electrode 148d serves as one electrode of the capacitor 165.

Figure 7D:
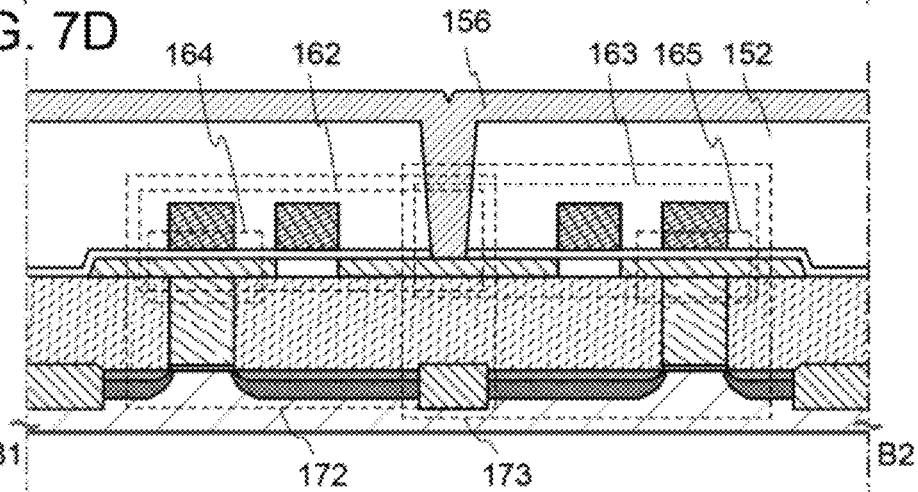

Next, the interlayer insulating layer 152 is formed so as to cover the gate insulating layer 146, the gate electrodes 148a and 148b, and the electrodes 148c and 148d (see FIG. 7D). Note that although FIG. 7D illustrates the case where only the interlayer insulating layer 152 is formed, the interlayer insulating layers 150 and 152 may be stacked as illustrated in FIG. 5B.

Next, an opening reaching the oxide semiconductor layer 143 is formed by selectively etching the interlayer insulating layer 152 and the gate insulating layer 146. After that, a conductive layer is formed over the interlayer insulating layer 152 and selectively etched, whereby the wiring 156 is formed (see FIG. 7D). The wiring 156 serves as the other of the source electrode and the drain electrode of the transistor 162 and serves as the other of the source electrode and the drain electrode of the transistor 163.

Through the above steps, the transistors 162 and 163 and the capacitors 164 and 165 can be formed over the transistors 160 and 161. Accordingly, the memory cell 172 including the transistors 160 and 162 and the capacitor 164, and the memory cell 173 including the transistors 161 and 163 and the capacitor 165 can be formed.

Embodiment 3

In this embodiment, a semiconductor device partly different from the semiconductor device shown in the above embodiment is described with reference to FIG. 8 and FIGS. 9A to 9C. Note that in this embodiment, only different portions from the above embodiment will be described.

<Example of Structure of Semiconductor Device>

Figure 8:
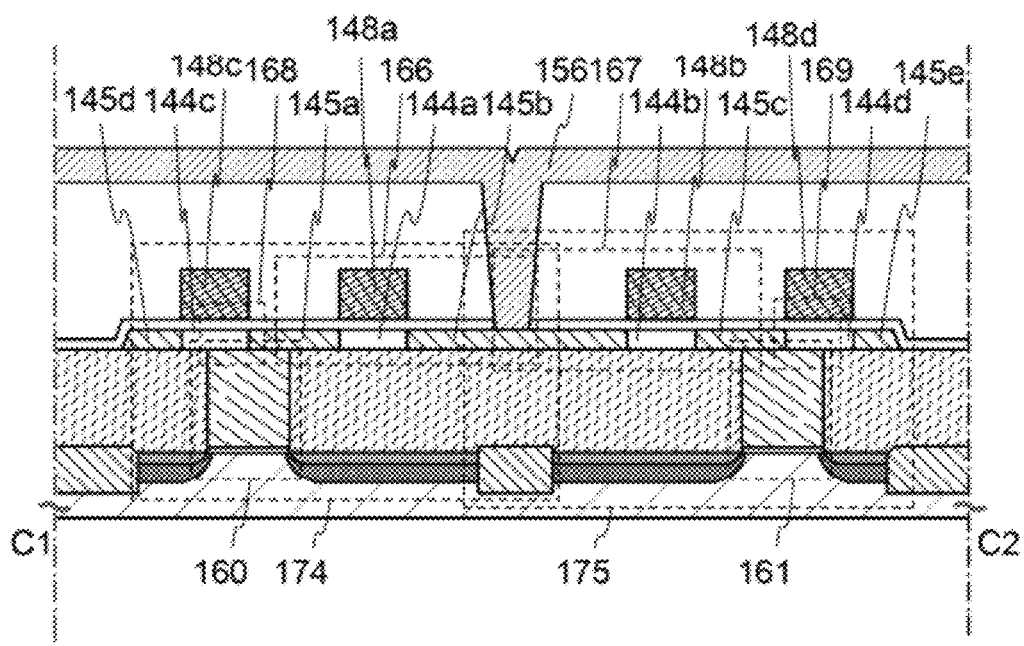
FIG. 8 is a cross-sectional view of a semiconductor device.

The semiconductor device illustrated in FIG. 8 includes, in a lower portion, the transistors 160 and 161, and in an upper portion, a transistor 166, a transistor 167, a capacitor 168, and a capacitor 169. In addition, the transistors 160 and 166 and the capacitor 168 can form a memory cell 174, and the transistors 161 and 167 and the capacitor 169 can form a memory cell 175. Note that the structures of the transistors 160 and 161 in the lower portion are similar to those of the transistors 160 and 161 illustrated in FIG. 6A and thus is not described in detail.

The capacitor 168 includes the gate electrode 110a, the oxide semiconductor layer 143, the gate insulating layer 146, and the electrode 148c. Further, in the capacitor 168, the oxide semiconductor layer 143 includes a region 144c to which an impurity element is not added. Similarly, the capacitor 169 includes the gate electrode 110b, the oxide semiconductor layer 143, the gate insulating layer 146, and the electrode 148d. Further, in the capacitor 169, the oxide semiconductor layer 143 includes a region 144d to which an impurity element is not added.

Although not illustrated, sidewall insulating layers may be provided on the side surfaces of the gate electrodes 148a and 148b and the electrodes 148c and 148d in the transistors 166 and 167, and the impurity regions may include a region having a different impurity concentration.

As illustrated in FIG. 8, the gate electrode 110a of the transistor 160 serves as one of a source electrode and a drain electrode of the transistor 166, whereby one of the source electrode and the drain electrode of the transistor 166 does not need to be connected to another wiring through an opening in the interlayer insulating layer 152. In addition, the transistors 166 and 167 are formed using one oxide semiconductor layer, the oxide semiconductor layer 143. Further, the transistors 166 and 167 are connected to each other by sharing the wiring 156 serving as a source electrode and a drain electrode. Further, in adjacent memory cells, the other of the source electrode and the drain electrode of the transistor 166 and the other of the source electrode and the drain electrode of the transistor 167, which include the oxide semiconductor layer 143, can be electrically connected to each other.

Through the above steps, the area occupied by the memory cells 174 and 175 can be reduced, whereby the degree of integration of a semiconductor device can be enhanced and the storage capacity per unit area can be increased.

Note that the circuit configuration of the memory cells illustrated in FIG. 8 is similar to that in FIG. 6B and thus is not described in detail.

<Example of Method for Manufacturing Semiconductor Device>

Next, a method for manufacturing the semiconductor device illustrated in FIG. 8 will be described with reference to FIGS. 9A to 9C. Note that steps up to the step of forming the gate insulating layer 146 are the same as the steps in Embodiments 1 and 2; therefore, the detailed descriptions are omitted here.

Figure 9A:
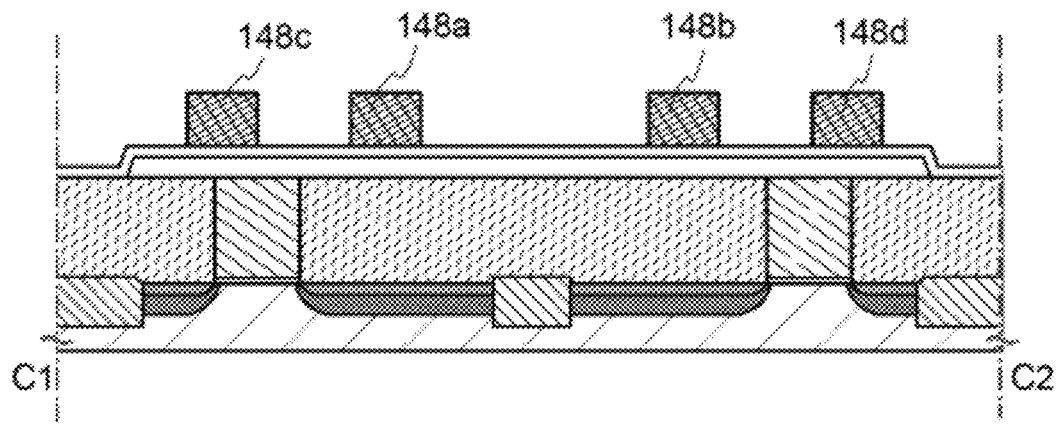
FIGS. 9A to 9C are cross-sectional views illustrating a manufacturing process of a semiconductor device.

Next, the gate electrodes 148a and 148b and the electrodes 148c and 148d are formed over the gate insulating layer 146 (see FIG. 9A). For the gate electrodes 148a and 148b and the electrodes 148c and 148d, description of FIG. 7C can be referred to.

Figure 9B:
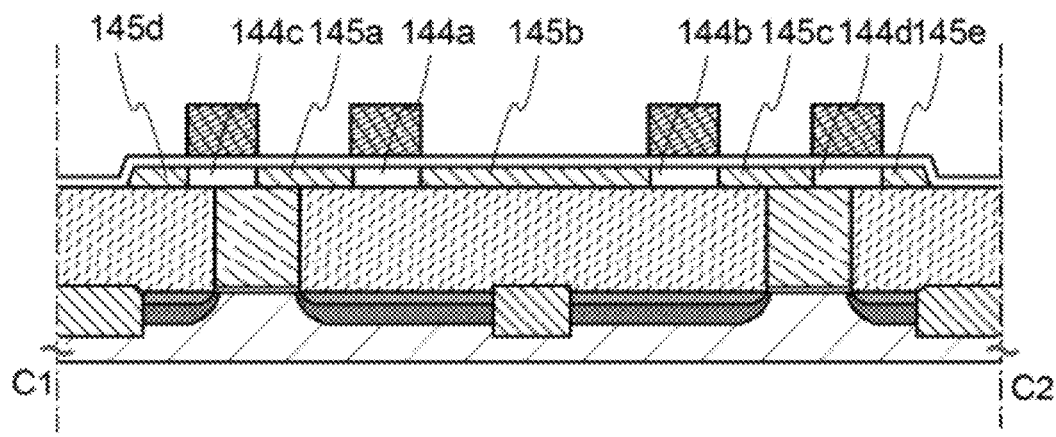
Figure 9C:
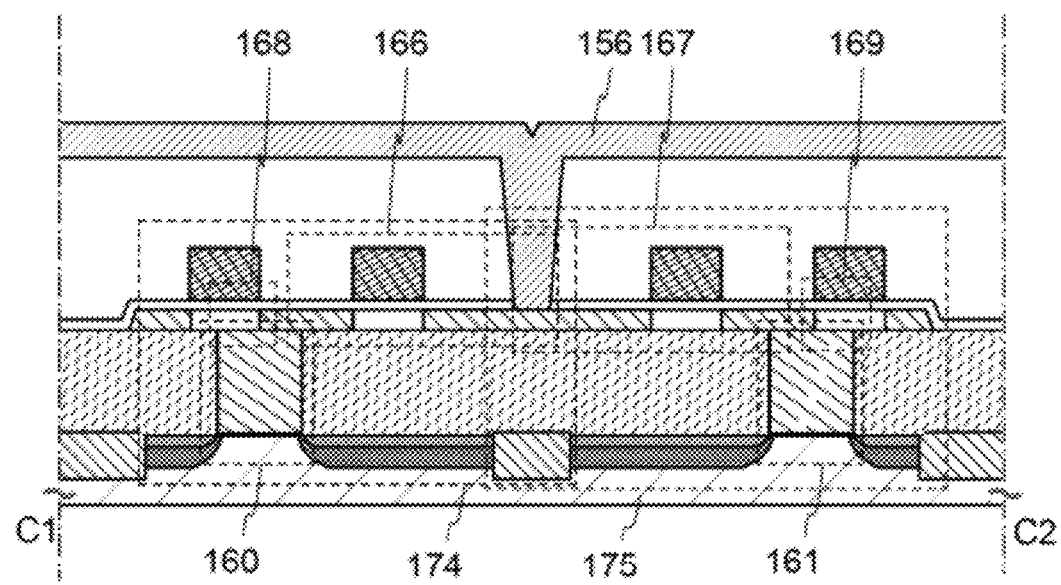

Next, the low-resistance region 145a, the low-resistance region 145b, the low-resistance region 145c, a low-resistance region 145d, and a low-resistance region 145e are formed by adding an impurity element to the oxide semiconductor layer 143 through the gate insulating layer 146, using the gate electrodes 148a and 148b and the electrodes 148c and 148d as masks (see FIG. 9B). Accordingly, the channel formation regions 144a and 144b and the regions 144c and 144d to which an impurity element is not added are formed. Note that the channel formation regions 144a and 144b and regions 144c and 144d to which an impurity element is not added have higher resistance than the low-resistance regions 145a to 145e. For the method for adding an impurity element or the like, description of FIG. 5A can be referred to.

Next, after the interlayer insulating layer 152 is formed so as to cover the gate insulating layer 146, the gate electrodes 148a and 148b, and the electrodes 148c and 148d, an opening reaching the oxide semiconductor layer 143 is formed by selectively etching the interlayer insulating layer 152 and the gate insulating layer 146. After that, a conductive layer is formed over the interlayer insulating layer 152 and selectively etched, whereby the wiring 156 is formed (see FIG. 9C). The wiring 156 serves as the other of the source electrode and the drain electrode of the transistor 166 and serves as the other of the source electrode and the drain electrode of the transistor 167.

Through the above steps, the transistors 166 and 167 and the capacitors 168 and 169 can be formed over the transistors 160 and 161. Accordingly, the memory cell 174 including the transistors 160 and 166 and the capacitor 168, and the memory cell 175 including the transistors 161 and 167 and the capacitor 169 can be formed.

In the manufacturing process of this embodiment, the step of forming the masks 127a and 127b described in Embodiment 2 (see FIG. 7B) can be omitted; therefore, the manufacturing process of a semiconductor device can be simplified.

Embodiment 4

The case where the semiconductor device according to one embodiment of the present invention is applied to a portable device such as a mobile phone, a smartphone, or an e-book reader will be described with reference to FIGS. 10A and 10B, FIG. 11, FIG. 12, and FIG. 13.

In such portable devices, an SRAM or a DRAM is used so as to store image data temporarily. An SRAM or a DRAM is used because a flash memory, whose response is slow, is unsuitable to be used for image processing.

On the other hand, there are following disadvantages when an SRAM or a DRAM is used to store image data temporarily. Note that an SRAM has an advantage of high response speed.

Figure 10A:
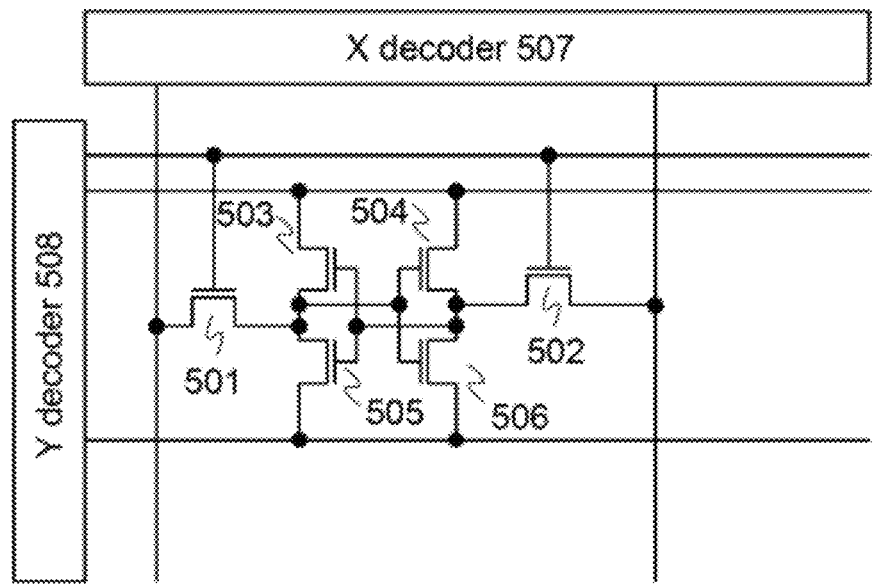
FIGS. 10A and 10B are circuit diagrams of a semiconductor device.

As illustrated in FIG. 10A, one memory cell of an SRAM generally includes six transistors, a transistor 501, a transistor 502, a transistor 503, a transistor 504, a transistor 505, and a transistor 506, which are driven with an X decoder 507 and a Y decoder 508. A pair of the transistors 503 and 505 and a pair of the transistors 504 and 506 which each form an inverter allow high-speed operation.

However, since one memory cell includes six transistors, the area of a memory cell is large, which is disadvantageous. Provided that the minimum feature size of a design rule is F, the area of a memory cell in an SRAM is generally 100 $F^2$ to 150 $F^2$. Therefore, there is a problem in that a price per bit of an SRAM is the most expensive among various memories.

Figure 10B:
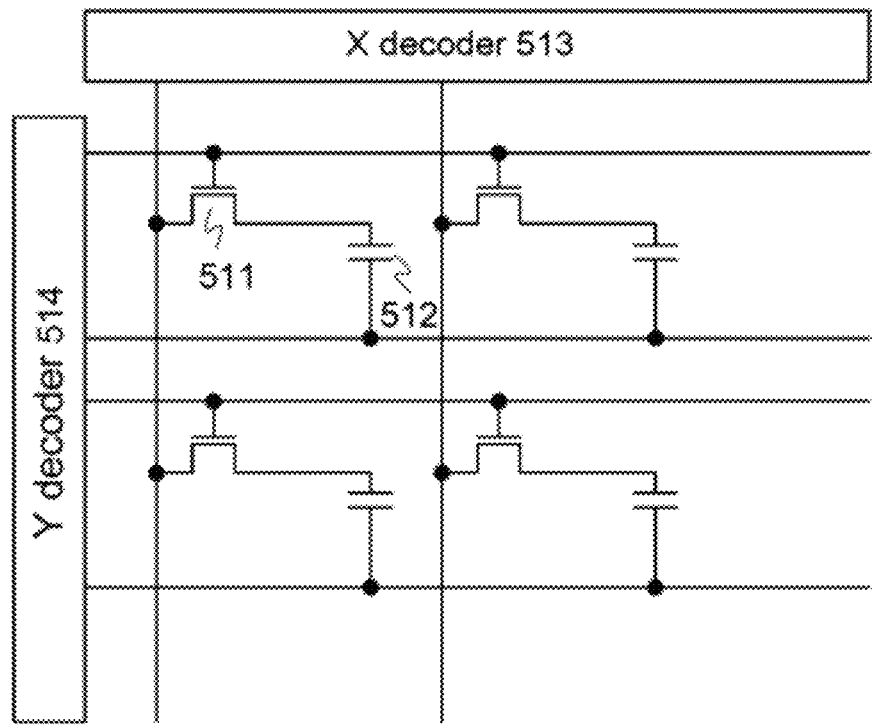

On the other hand, as illustrated in FIG. 10B, one memory cell of a DRAM includes a transistor 511 and a storage capacitor 512, which are driven with an X decoder 513 and a Y decoder 514. One memory cell includes one transistor and one capacitor, and thus has a small area. The area of a memory cell of a DRAM is generally less than or equal to 10 $F^2$. However, a DRAM has a problem in that a refresh operation is always necessary and power is consumed even when a rewriting operation is not performed.

The area of a memory cell according to one embodiment of the present invention is around 10 $F^2$ and frequent refresh operations are not necessary.

With the use of a memory cell according to one embodiment of the present invention, two problems in the area and power consumption of a memory cell can be solved.

Figure 11:
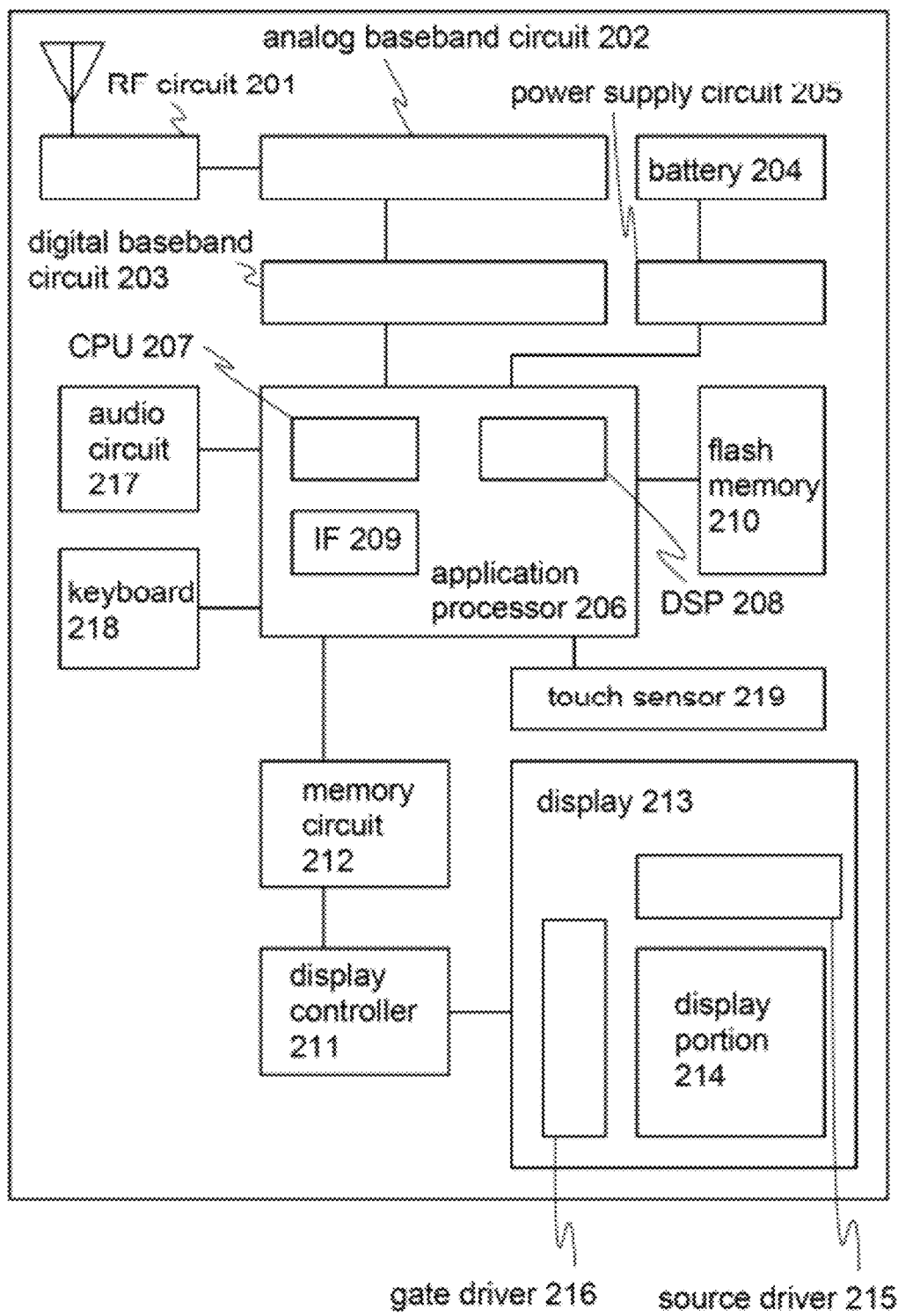
FIG. 11 is a block diagram of a semiconductor device.

Next, a block diagram of a portable device is illustrated in FIG. 11. The portable device illustrated in FIG. 11 includes an RF circuit 201, an analog baseband circuit 202, a digital baseband circuit 203, a battery 204, a power supply circuit 205, an application processor 206, a flash memory 210, a display controller 211, a memory circuit 212, a display 213, a touch sensor 219, an audio circuit 217, a keyboard 218, and the like. The display 213 includes a display portion 214, a source driver 215, and a gate driver 216. The application processor 206 includes a CPU 207, a DSP 208, and an interface (IF) 209. In general, the memory circuit 212 includes an SRAM or a DRAM, and unit cost and power consumption of a memory per bit can be reduced by employing a memory cell according to one embodiment of the present invention for the memory circuit 212.

Figure 12:
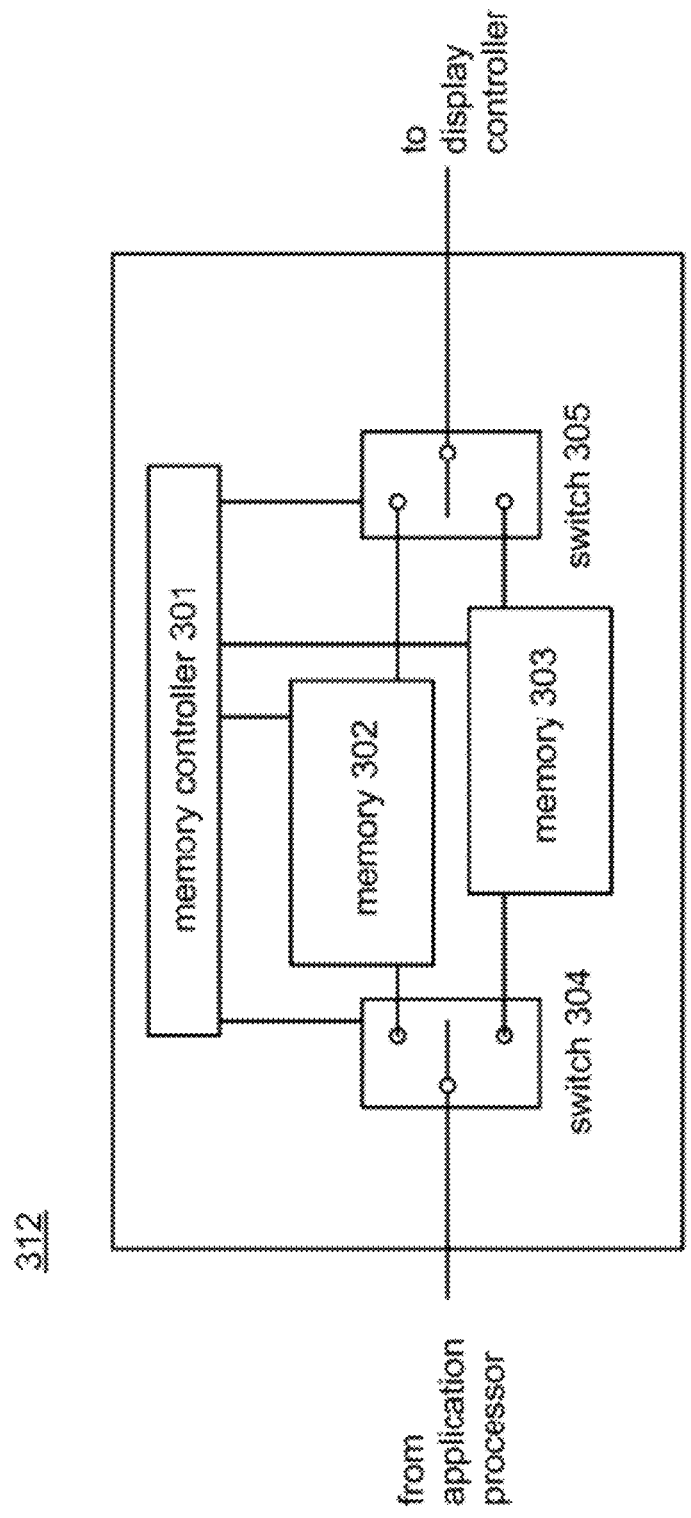
FIG. 12 is a block diagram of a semiconductor device.

Next, an example of using the semiconductor device according to one embodiment of the present invention for a memory circuit as a memory device is illustrated in FIG. 12. In FIG. 12, the memory circuit 312 includes a memory 302, a memory 303, a switch 304, a switch 305, and a memory controller 301. Specifically, the memory device according to one embodiment of the present invention is applied to the memories 302 and 303.

First, image data is received or formed by the application processor. The image data is stored in the memory 302 through the switch 304. Then, the image data is transmitted to the display through the switch 305 and the display controller and displayed. If there is no any change in the image data, data is read from the memory 302 at a cycle of about 30 Hz to 60 Hz in general, and the image data continues to be transmitted to the display controller through the switch 305. When users perform an operation of rewriting a screen, new image data is formed by the application processor and the image data is stored in the memory 303 through the switch 304. Image data is read periodically from the memory 302 through the switch 305 also during this period. When storing of the new image data in the memory 303 is completed, the data stored in the memory 303 is read from a next frame of the display, and the image data is transferred to the display through the switch 305 and the display controller and then the image data is displayed. This operation of reading data is continued until next image data is stored in the memory 302. In such a manner, data is written and read alternately in the memories 302 and 303, whereby the images are displayed on the display.

The memories 302 and 303 are not limited to separate memory chips and one memory chip may be divided between the memory 302 and the memory 303.

With the use of the memory device according to one embodiment of the present invention for the memories 302 and 303, unit cost and power consumption can be reduced.

Figure 13:
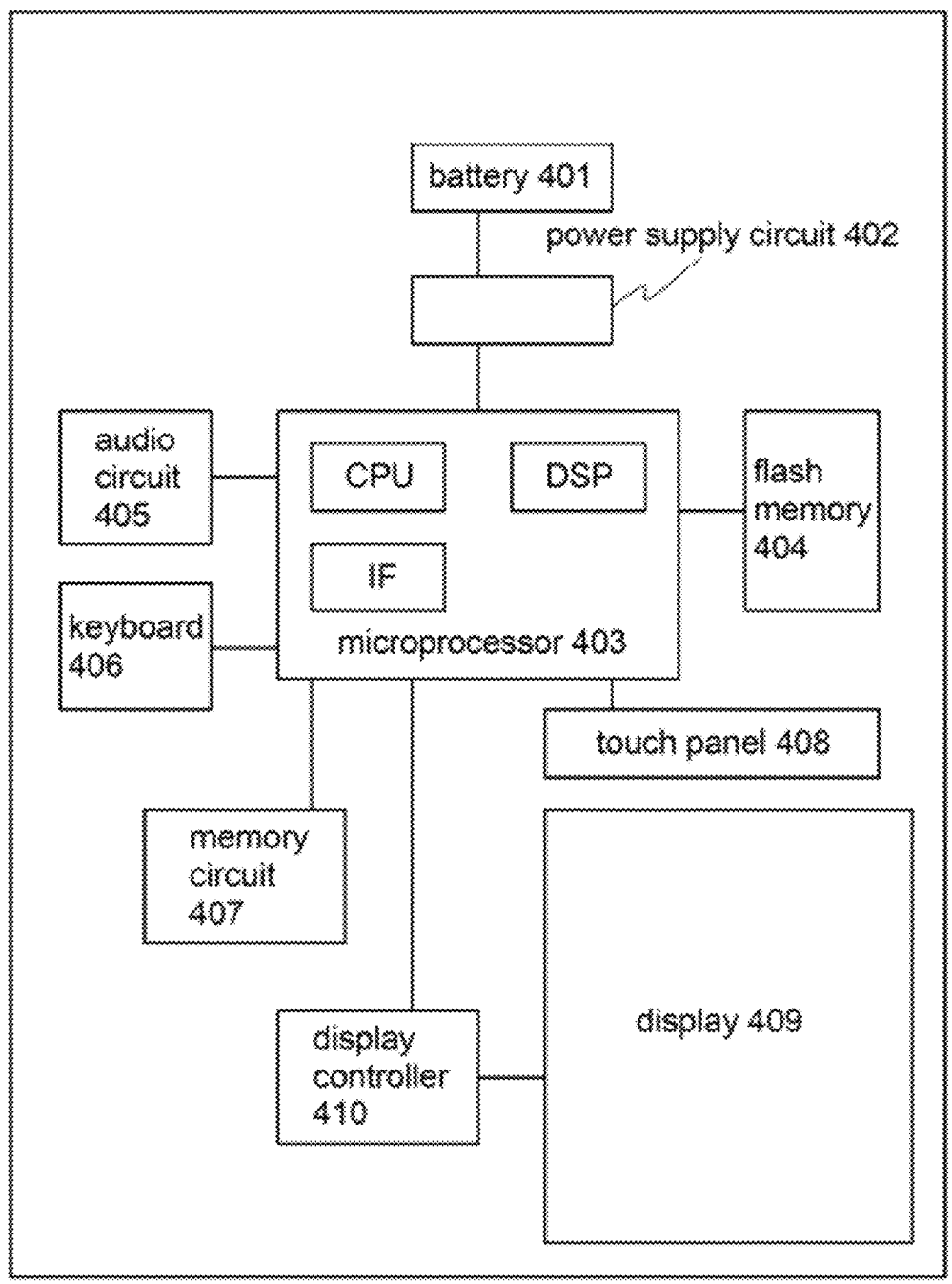
FIG. 13 is a block diagram of a semiconductor device.

Next, a block diagram of an e-book reader is illustrated in FIG. 13. The e-book reader illustrated in FIG. 13 includes a battery 401, a power supply circuit 402, a microprocessor 403, a flash memory 404, an audio circuit 405, a keyboard 406, a memory circuit 407, a touch panel 408, a display 409, and a display controller 410. The memory device according to one embodiment of the present invention can be used for the memory circuit 407. The memory circuit 407 has a function of temporarily storing the content of books. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding information of a place specified by users. In order to save information for a long time, the information may be copied into the flash memory 404.

Even in such cases, the use of the memory device according to one embodiment of the present invention for a memory can reduce unit cost and power consumption of a memory.

Embodiment 5

In this embodiment, the cases where the semiconductor device described in any of the above embodiments is applied to electronic devices will be described with reference to FIGS. 14A to 14F. In this embodiment, the cases where the above-described semiconductor device is applied as a memory device to electronic devices such as a computer, a mobile phone set (also referred to as a mobile phone or a mobile phone device), a portable information terminal (including a portable game machine, an audio reproducing device, and the like), a camera such as a digital camera or a digital video camera, electronic paper, and a television set (also referred to as a television or a television receiver) are described.

Figure 14A:
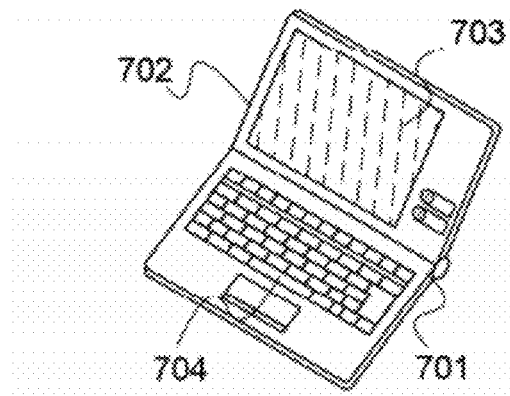
FIGS. 14A to 14F each illustrate an electronic device.

FIG. 14A illustrates a notebook personal computer, which includes a housing 701, a housing 702, a display portion 703, a keyboard 704, and the like. The memory device described in any of the above embodiments is provided as a memory in at least one of the housings 701 and 702. Since the memory device described in any of the above embodiments is highly integrated, the memory device can be downsized. Further, a notebook personal computer with sufficiently low power consumption, in which writing and reading of data can be performed at high speed and data can be stored for a long time, can be realized.

Figure 14D:
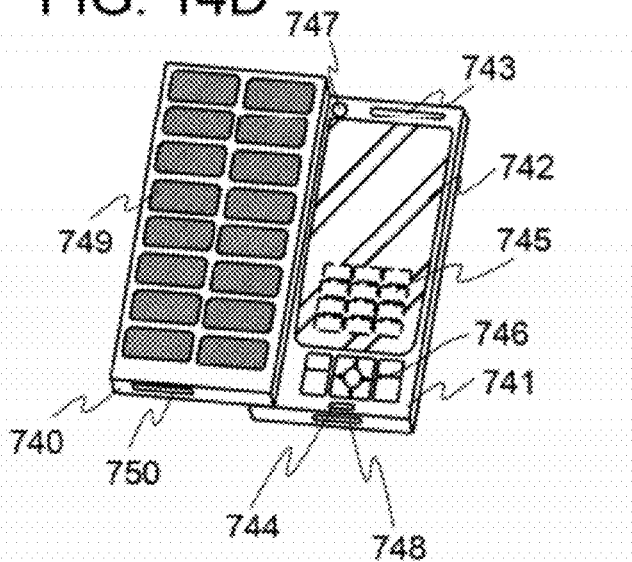
Figure 14B:
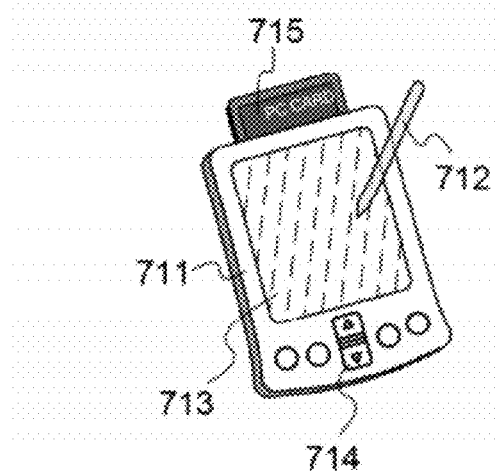

FIG. 14B illustrates a portable information terminal (personal digital assistant (PDA)). A main body 711 is provided with a display portion 713, an external interface 715, operation buttons 714, and the like. Further, a stylus 712 for operation of the portable information terminal, or the like is provided. The memory device described in any of the above embodiments is provided as a memory in the main body 711. Since the memory device described in any of the above embodiments is highly integrated, the memory device can be downsized. Further, a portable information terminal with sufficiently low power consumption, in which writing and reading of data can be performed at high speed and data can be stored for a long time, can be realized.

Figure 14E:
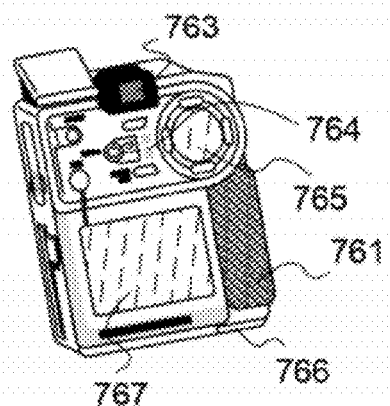
Figure 14C:
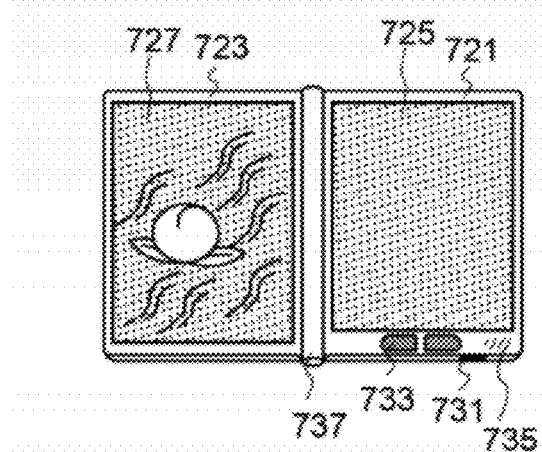

FIG. 14C illustrates an electronic book incorporating electronic paper, which includes two housings, a housing 721 and a housing 723. The housing 721 and the housing 723 include a display portion 725 and a display portion 727, respectively. The housing 721 is connected to the housing 723 by a hinge 737, so that the electronic book can be opened and closed using the hinge 737 as an axis. In addition, the housing 721 is provided with a power switch 731, operation keys 733, a speaker 735, and the like. At least one of the housings 721 and 723 is provided with the memory device described in any of the above embodiments as a memory. Since the memory device described in any of the above embodiments is highly integrated, the memory device can be downsized. Further, an electronic book with sufficiently low power consumption, in which writing and reading of data can be performed at high speed and data can be stored for a long time, can be realized.

FIG. 14D illustrates a mobile phone set, which includes two housings, a housing 740 and a housing 741. Moreover, the housings 740 and 741 in a state where they are developed as illustrated in FIG. 14D can be slid so that one is lapped over the other. Therefore, the mobile phone set can be downsized, which makes the mobile phone set suitable for being carried around. The housing 741 includes a display panel 742, a speaker 743, a microphone 744, operation keys 745, a pointing device 746, a camera lens 747, an external connection terminal 748, and the like. The housing 740 includes a solar cell 749 for charging the mobile phone set, an external memory slot 750, and the like. An antenna is incorporated in the housing 741. The memory device described in any of the above embodiments is provided in at least one of the housings 740 and 741 as a memory. Since the memory device described in any of the above embodiments is highly integrated, the memory device can be downsized. Further, a mobile phone set with sufficiently low power consumption, in which writing and reading of data can be performed at high speed and data can be stored for a long time, can be realized.

FIG. 14E illustrates a digital camera, which includes a main body 761, a display portion 767, an eyepiece 763, an operation switch 764, a display portion 765, a battery 766, and the like. The memory device described in any of the above embodiments is provided in the main body 761 as a memory. Since the memory device described in any of the above embodiments is highly integrated, the memory device can be downsized. Thus, a digital camera with sufficiently low power consumption, in which writing and reading of data can be performed at high speed and data can be stored for a long time, can be realized.

Figure 14F:
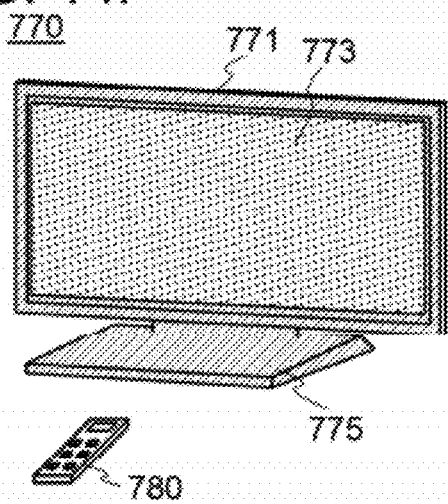

FIG. 14F is a television set 770, which includes a housing 771, a display portion 773, a stand 775, and the like. The television set 770 can be operated with a switch included in the housing 771 or with a remote controller 780. The memory device described in any of the above embodiments is mounted in the housing 771 and the remote controller 780. Since the memory device described in any of the above embodiments is highly integrated, the memory device can be downsized. Further, a television set with sufficiently low power consumption, in which writing and reading of data can be performed at high speed and data can be stored for a long time, can be realized.

As described above, the electronic devices described in this embodiment each include the semiconductor device according to any of the above embodiments. Therefore, electronic devices with low power consumption can be realized.

This application is based on Japanese Patent Application Serial No. 2010-293343 filed with Japan Patent Office on Dec. 28, 2010, the entire contents of which are hereby incorporated by reference.

What is claimed is:

1. A semiconductor device comprising:
    a semiconductor substrate;
    a first transistor;
    a semiconductor layer having a first region, a second region, and a third region, a resistance of the third region being higher than that of the second region;
    a second transistor comprising the first region and the second region; and
    a capacitor comprising the third region,
    wherein the first transistor comprises:
        a channel formation region and an impurity region in the semiconductor substrate; and
        a gate electrode in direct contact with bottom surfaces of the second region and the third region of the semiconductor layer, and
    wherein the semiconductor substrate includes a semiconductor material other than an oxide semiconductor material included in the semiconductor layer.

2. The semiconductor device according to claim 1, wherein the gate electrode serves as one of a source electrode and a drain electrode of the second transistor.

3. The semiconductor device according to claim 1, wherein the oxide semiconductor material comprises a crystal which is c-axis aligned, has a triangular or hexagonal atomic arrangement when seen from the direction perpendicular to an a-b plane, and has a variation in the direction of an a-axis or a b-axis in the a-b plane.

4. A semiconductor device comprising:
    a semiconductor substrate;
    a first transistor comprising:
        a first impurity region and a second impurity region in the semiconductor substrate;
        a first channel formation region between the first impurity region and the second impurity region;
        a first gate insulating layer over the first channel formation region; and
        a first gate electrode over the first gate insulating layer;
    a semiconductor layer including an oxide semiconductor material comprising:
        a first low-resistance region;
        a second low-resistance region;
        a second channel formation region therebetween; and
        a region whose resistance is higher than that of the second low-resistance region;
    a second transistor comprising:
        the first low-resistance region, the second low-resistance region, and the second channel formation region;
        a second gate insulating layer over the semiconductor layer; and
        a second gate electrode over the second gate insulating layer; and
    a capacitor comprising the region,
    wherein the first gate electrode is in direct contact with bottom surfaces of the region and the second low-resistance region, and
    wherein the semiconductor substrate includes a semiconductor material other than the oxide semiconductor material.

5. The semiconductor device according to claim 4, wherein the first gate electrode serves as one of a source electrode and a drain electrode of the second transistor.

6. The semiconductor device according to claim 4, further comprising:
    a conductive layer in contact with the first low-resistance region.

7. The semiconductor device according to claim 4, further comprising:
    a conductive layer over the first gate electrode with the semiconductor layer and the second gate insulating layer sandwiched between the conductive layer and the first gate electrode.

8. The semiconductor device according to claim 7, wherein the capacitor further comprises the first gate electrode, the second gate insulating layer, and the conductive layer.

9. The semiconductor device according to claim 4, further comprising:
    a first conductive layer over the first gate electrode with the semiconductor layer and the second gate insulating layer sandwiched between the first conductive layer and the first gate electrode, and
    a second conductive layer in contact with the first low-resistance region.

10. The semiconductor device according to claim 9, wherein the capacitor further comprises the first gate electrode, the second gate insulating layer, and the first conductive layer.

11. The semiconductor device according to claim 4, wherein the first transistor further comprises:
    a source electrode and a drain electrode in contact with the first impurity region and the second impurity region, respectively.

12. The semiconductor device according to claim 4, wherein the second gate electrode includes an In—Ga—Zn—O—N-based compound conductor.

13. The semiconductor device according to claim 4, wherein the oxide semiconductor material comprises a crystal which is c-axis aligned, has a triangular or hexagonal atomic arrangement when seen from the direction perpendicular to an a-b plane, and has a variation in the direction of an a-axis or a b-axis in the a-b plane.

* * * * *